United States Patent
Liu et al.

(10) Patent No.: US 10,957,580 B2
(45) Date of Patent: *Mar. 23, 2021

(54) METAL ROUTING WITH FLEXIBLE SPACE FORMED USING SELF-ALIGNED SPACER PATTERNING

(71) Applicant: Taiwan Semiconductor Manufacturing Co., Ltd., Hsinchu (TW)

(72) Inventors: Hsiang-Wei Liu, Tainan (TW); Chia-Tien Wu, Taichung (TW); Wei-Chen Chu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/983,475

(22) Filed: Aug. 3, 2020

(65) Prior Publication Data

US 2020/0365449 A1 Nov. 19, 2020

Related U.S. Application Data

(63) Continuation of application No. 16/727,593, filed on Dec. 26, 2019, now Pat. No. 10,734,275, which is a
(Continued)

(51) Int. Cl.
*H01L 21/768* (2006.01)
*H01L 21/033* (2006.01)
(Continued)

(52) U.S. Cl.
CPC .... *H01L 21/76802* (2013.01); *H01L 21/0337* (2013.01); *H01L 21/31144* (2013.01); *H01L 21/31155* (2013.01); *H01L 21/76879* (2013.01)

(58) Field of Classification Search
CPC ............. H01L 21/0337; H01L 21/3086; H01L 21/0338; H01L 21/32139; H01L 21/3088; H01L 29/6656
See application file for complete search history.

(56) References Cited

U.S. PATENT DOCUMENTS 7,429,533 B2   9/2008   Huang et al.
7,989,355 B2   8/2011   Shieh et al.
(Continued)

FOREIGN PATENT DOCUMENTS

CN   101221899 A   7/2008
CN   101496141 A   7/2009
(Continued)

OTHER PUBLICATIONS

Chen, et al., "48nm Pitch cu dual-damascene interconnects using self aligned double patterning scheme," IEEE International Interconnect Technology Conference, Kyoto, Japan, Jun. 13-15, 2013, 3 pages.

*Primary Examiner* — Zandra V Smith
*Assistant Examiner* — John M Parker
(74) *Attorney, Agent, or Firm* — Slater Matsil, LLP

(57) ABSTRACT

A method includes forming a hard mask over a target layer, performing a treatment on a first portion of the hard mask to form a treated portion, with a second portion of the hard mask left untreated as an untreated portion. The method further includes subjecting both the treated portion and the untreated portion of the hard mask to etching, in which the untreated portion is removed as a result of the etching, and the treated portion remains after the etching. A layer underlying the hard mask is etched, and the treated portion of the hard mask is used as a part of an etching mask in the etching.

20 Claims, 26 Drawing Sheets

Related U.S. Application Data continuation of application No. 15/800,753, filed on Nov. 1, 2017, now Pat. No. 10,529,617.

(60) Provisional application No. 62/565,633, filed on Sep. 29, 2017.

(51) Int. Cl.
*H01L 21/311* (2006.01)
*H01L 21/3115* (2006.01)

(56) References Cited

U.S. PATENT DOCUMENTS

| | | | |
|---|---|---|---|
| 8,110,466 | B2 | 2/2012 | Sheih et al. |
| 9,136,162 | B2 | 9/2015 | Huang et al. |
| 9,153,478 | B2 | 10/2015 | Lin et al. |
| 9,312,328 | B2 | 4/2016 | He |
| 9,768,025 | B2 | 9/2017 | Siew et al. |
| 9,929,013 | B2 | 3/2018 | Kim et al. |
| 9,941,139 | B2 | 4/2018 | Yen |
| 9,947,535 | B2 | 4/2018 | Huang et al. |
| 10,256,096 | B2 | 4/2019 | Huang et al. |
| 10,332,987 | B2 | 6/2019 | Ning et al. |
| 2007/0161251 | A1 | 7/2007 | Tran et al. |
| 2007/0264830 | A1 | 11/2007 | Huang et al. |
| 2009/0118153 | A1 | 5/2009 | Rath et al. |
| 2010/0203734 | A1 | 8/2010 | Shieh et al. |
| 2011/0104898 | A1* | 5/2011 | Lee .................. H01L 21/32139 438/689 |
| 2012/0282779 | A1 | 11/2012 | Arnold et al. |
| 2013/0115721 | A1 | 5/2013 | Clark |
| 2013/0334614 | A1 | 12/2013 | Liaw |
| 2014/0027923 | A1 | 1/2014 | Tseng et al. |
| 2015/0031210 | A1 | 1/2015 | Ban et al. |
| 2015/0235905 | A1 | 8/2015 | Liaw et al. |
| 2016/0181103 | A1 | 6/2016 | He |
| 2017/0221702 | A1 | 8/2017 | Lee et al. |
| 2017/0263460 | A1 | 9/2017 | Ruffell et al. |
| 2018/0174853 | A1 | 6/2018 | Shen et al. |

FOREIGN PATENT DOCUMENTS

| | | |
|---|---|---|
| CN | 103839781 A | 6/2014 |
| CN | 105321874 A | 2/2016 |
| CN | 105977205 A | 9/2016 |
| CN | 106206263 A | 12/2016 |
| CN | 106997849 A | 8/2017 |
| CN | 107039246 A | 8/2017 |
| KR | 20150065609 A | 6/2015 |
| KR | 20160030430 A | 3/2016 |
| TW | 201030899 A | 8/2010 |

* cited by examiner

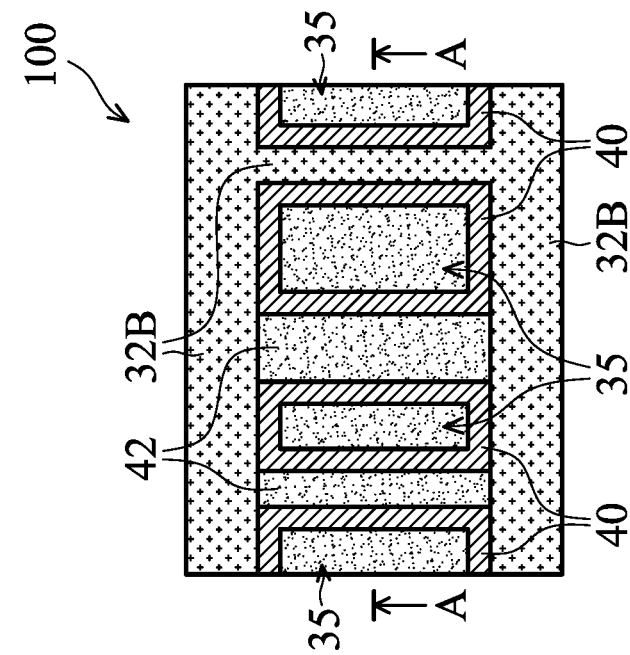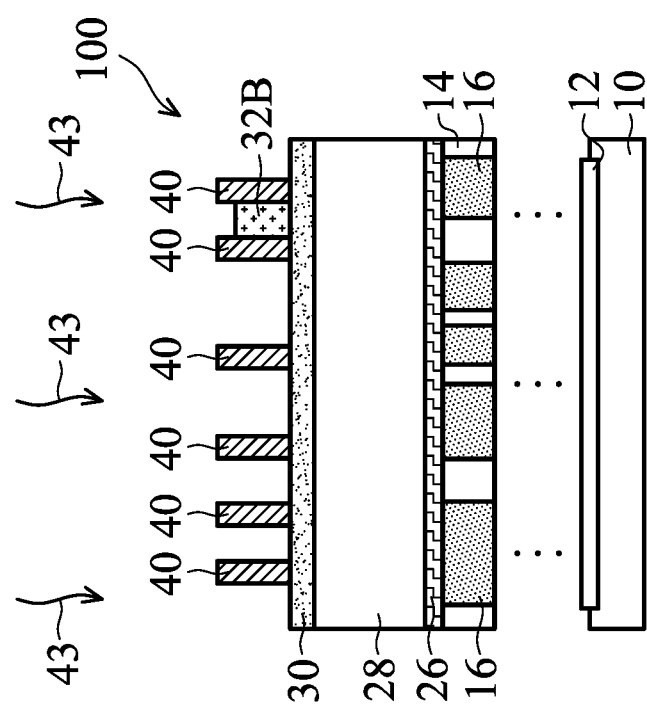

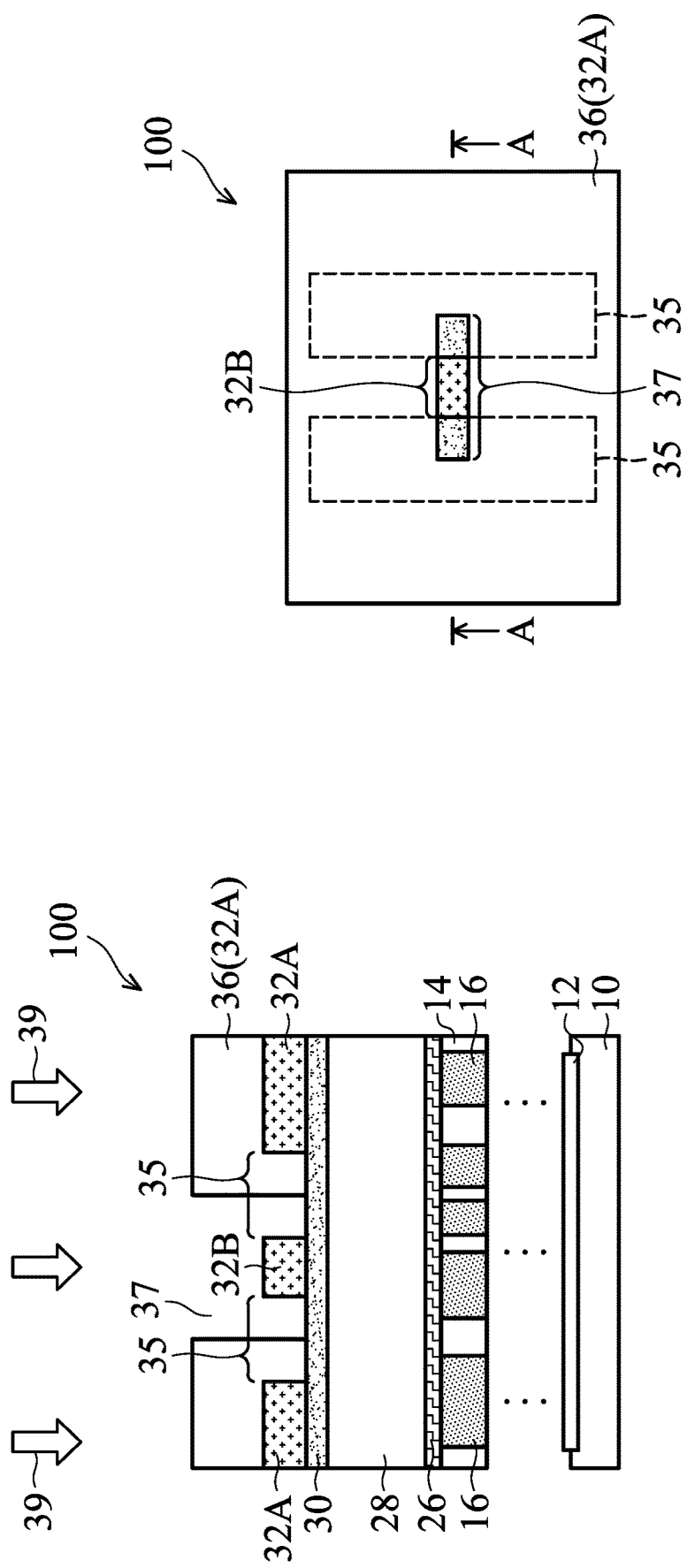

METAL ROUTING WITH FLEXIBLE SPACE FORMED USING SELF-ALIGNED SPACER PATTERNING

PRIORITY CLAIM AND CROSS-REFERENCE

This application is a continuation of U.S. patent application Ser. No. 16/727,593, entitled "Metal Routing with Flexible Space Formed Using Self-Aligned Spacer Patterning," filed Dec. 26, 2019, which is a continuation of U.S. patent application Ser. No. 15/800,753, entitled "Metal Routing with Flexible Space Formed Using Self-Aligned Spacer Patterning," filed Nov. 1, 2017, now U.S. Pat. No. 10,529,617 issued on Jan. 7, 2020, which claims the benefit of Provisional Application No. 62/565,633, filed Sep. 29, 2017, and entitled "Metal Routing with Flexible Space Formed Using Self-Aligned Spacer Patterning," which applications are hereby incorporated herein by reference.

BACKGROUND

Double patterning is a technology developed for lithography to enhance the feature density. Typically, for forming features of integrated circuits on wafers, the lithography technology is used, which involves applying a photo resist, and defining features on the photo resist. The features in the patterned photo resist are first defined in a lithography mask, and are implemented either by the transparent portions or by the opaque portions in the lithography mask. The features in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. In the double patterning technology, the closely located features are separated to two photolithography masks of a same double-patterning mask set, with both masks used to expose the same photo resist, or used to pattern the same hard mask. In each of the masks, the distances between features are increased over the distances between features in the otherwise a single mask, and hence the optical proximity effect is reduced, or substantially eliminated in the double patterning masks.

The double patterning, however, also suffers from drawbacks. For example, when two features have their lengthwise directions aligned to a same straight line, and the line ends of the features face each other, it is difficult to control the uniformity of the line end space due to the proximity effect and overlay variation. The line spacings and the widths of the features are also difficult to control, especially when there are other features close to these two features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 11A and 11B are cross-sectional views and top views of intermediate stages in the formation of metal lines in accordance with some embodiments.

FIGS. 13A and 13B through FIGS. 22A, 22B, and 22C are cross-sectional views and top views of intermediate stages in the formation of metal lines in accordance with some embodiments.

DETAILED DESCRIPTION

Figure 1:
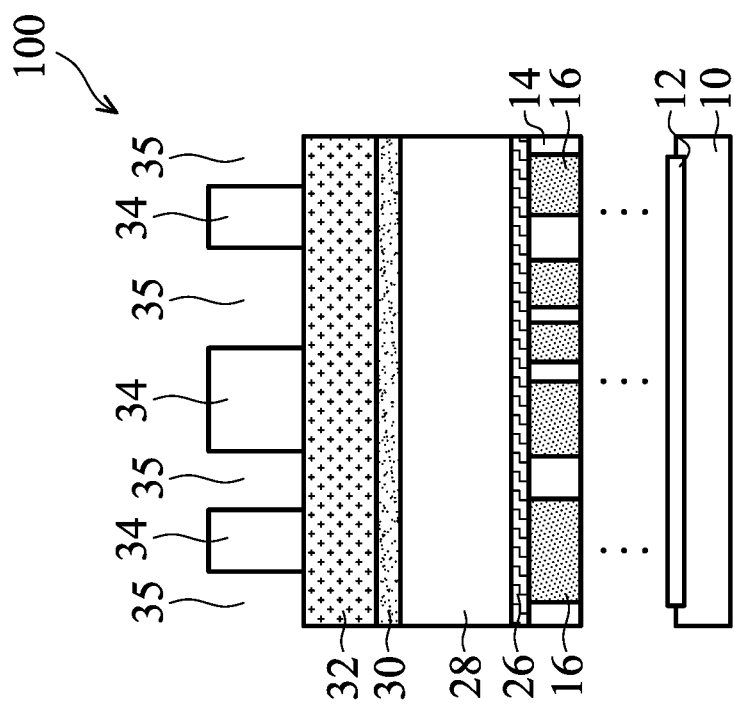

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Features such as metal lines and the methods of forming the same are provided in accordance with various exemplary embodiments. The intermediate stages of forming the features are illustrated in accordance with some embodiments. Some variations of some embodiments are discussed. Throughout the various views and illustrative embodiments, like reference numbers are used to designate like elements.

FIGS. 1 through 11A and 11B illustrate top views and cross-sectional views of intermediate stages in the formation of features in a target layer in accordance with some exemplary embodiments. In FIGS. 1 through 11A and 11B, and in FIGS. 13A and 13B through FIGS. 22A and 22B, the figure numbers may include letter "A" or letter "B." The letter "A" indicates that the respective figure shows a cross-sectional view. The letter "B" indicates that the respective figure shows a top view. The figures having the same digits and different letters "A" and "B" indicate that they are the different views of a same process step. Furthermore, the cross-sectional views are obtained from the plane containing line A-A in the respective top views.

FIG. 1 illustrates a cross-sectional view of wafer 100, which includes substrate 10 and the overlying layers. Substrate 10 may be formed of a semiconductor material such as silicon, silicon germanium, or the like. In accordance with some embodiments of the present disclosure, substrate 10 is a crystalline semiconductor substrate such as a crystalline silicon substrate, a crystalline silicon carbon substrate, a crystalline silicon germanium substrate, a III-V compound semiconductor substrate, or the like. Active devices 12, which may include transistors therein, are formed at a top surface of substrate 10.

Dielectric layer 14 is formed over substrate 10. In accordance with some embodiments of the present disclosure, dielectric layer 14 is an Inter-Metal Dielectric (IMD) or an Inter-Layer Dielectric (ILD), which may be formed of a dielectric material having a dielectric constant (k value) lower than 3.8, lower than about 3.0, or lower than about 2.5, for example. In accordance with some embodiments of the present disclosure, conductive features 16, which may be metallic features such as copper lines or tungsten contact plugs, are formed in dielectric layer 14. Etch stop layer 26 is formed over dielectric layer 14. Etch stop layer 26 may be formed of a dielectric material such as silicon carbide, silicon nitride, silicon oxy-carbide, silicon oxy-nitride, or the like.

Dielectric layer 28 is further formed over etch stop layer 26. Dielectric layer 28 may be an IMD layer, which is formed of a dielectric material having a dielectric constant (k value) lower than 3.8, lower than about 3.0, or lower than about 2.5, for example. Dielectric layer 28 may be a compound including carbon, and may have pores therein. In accordance with alternative embodiments of the present disclosure, dielectric layer 28 is a non-low-k dielectric layer having a k value equal to or higher than 3.8.

In accordance with alternative embodiments of the present disclosure, layer 28 is a semiconductor substrate. In accordance with these embodiments of the present disclosure, there may not be additional layers underlying layer 28. Hence, the illustrated layers 10, 14, and 16 as shown in FIG. 1 may not exist in accordance with these embodiments. Throughout the description, layer 28 is also referred to as a target layer, in which a plurality of patterned features is to be formed therein in accordance with some embodiments of the present disclosure.

Over dielectric layer 28 resides hard mask 30, which may be formed of a dielectric material such as silicon oxide (such as TEOS oxide), silicon nitride, Nitrogen-Free Anti-Reflective Coating (NFARC, which is an oxide), silicon carbide, silicon oxynitride, silicon oxy-carbide, or the like. The formation methods include Plasma Enhance Chemical Vapor Deposition (PECVD), High-Density Plasma (HDP) deposition, Chemical Vapor Deposition (CVD), Atomic Layer Deposition (ALD), or the like.

Hard mask 32 is formed over dielectric hard mask 30. In accordance with some embodiments of the present disclosure, hard mask 32 is in contact with dielectric hard mask 30, with no additional layer formed between hard mask 32 and dielectric hard mask 30. In accordance with some embodiments of the present disclosure, hard mask 32 is formed of amorphous silicon or another material that has a high etching selectivity relative to the underlying dielectric hard mask 30. For example, the etching selectivity, which is the ratio of the etching rate of hard mask 32 to the etching rate of hard mask 30, is greater than about 20 or greater than about 50 when hard mask 32 is etched. Throughout the description, hard mask 32 is also referred to as a mandrel layer.

Figure 12:
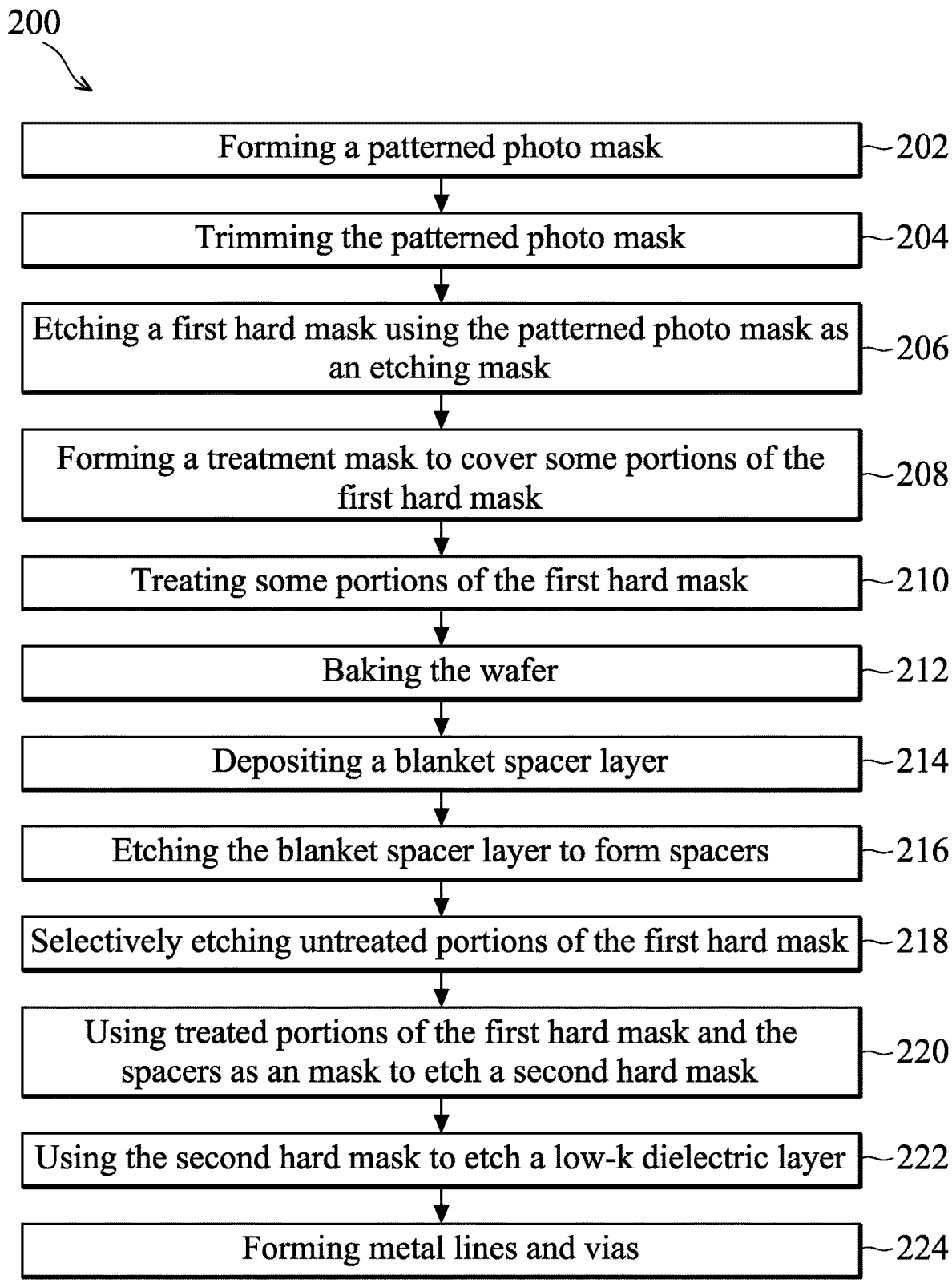
FIG. 12 illustrates a process flow for forming metal lines in accordance with some embodiments.

FIG. 1 also illustrates a first photolithography process. Over hard mask 32 is formed photo mask 34, which may include a single photo resist or a tri-layer photo mask. The tri-layer may include an under layer (sometimes referred to as a bottom layer), a middle layer over the under layer, and an upper layer over the middle layer. In accordance with some embodiments of the present disclosure, the under layer and the upper layer are formed of photo resists, which are formed of organic materials. The middle layer may be formed of an inorganic material, which may be a nitride (such as silicon nitride), an oxynitride (such as silicon oxynitride), an oxide (such as silicon oxide), or the like. The middle layer has a high etching selectivity with relative to the upper layer and the under layer, and hence the upper layer is used as an etching mask for the patterning of the middle layer, and the middle layer is used as an etching mask for the patterning of the under layer. Photo mask 34 is applied and patterned, for example, in a photo lithography process. The respective step is illustrated as step 202 in the process flow shown in FIG. 12. Openings 35 are formed in photo mask 34. In accordance with some embodiments of the present disclosure, openings 35 have the top-view shapes of strips, which are parallel to each other.

Figure 2:
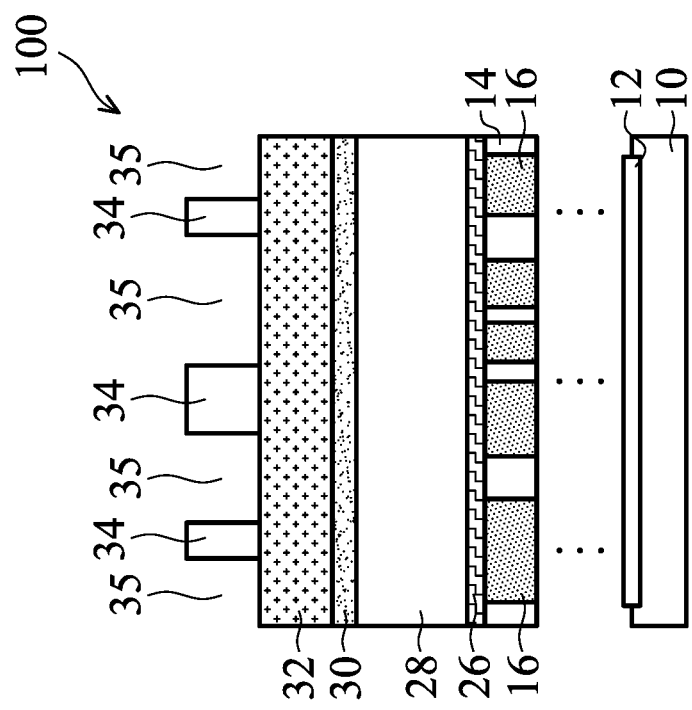

FIG. 2 illustrates the cross-sectional view of wafer 100 after a trimming step, which is used to reduce the widths of the strips of photo mask 34. The respective step is illustrated as step 204 in the process flow shown in FIG. 12. In accordance with some embodiments of the present disclosure, the trimming step includes an isotropic etching of photo mask 34, during which hard mask 32 is not attacked.

Figure 3B:
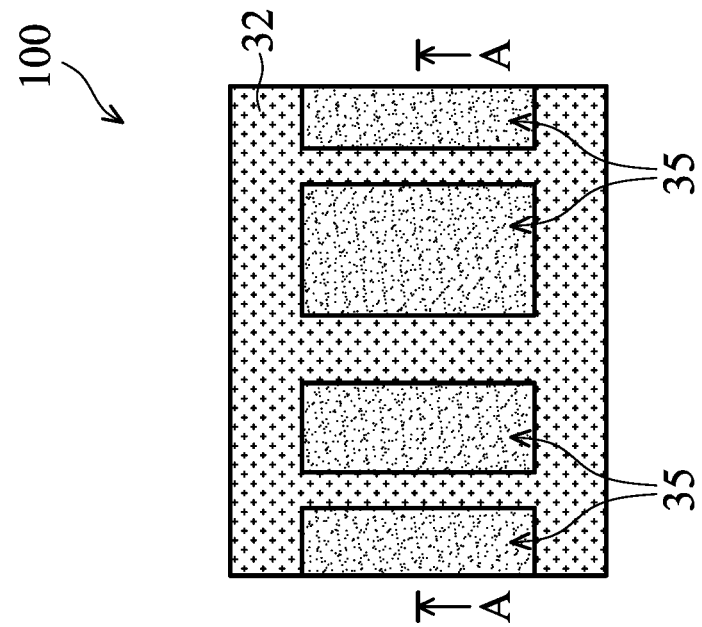
Figure 3A:
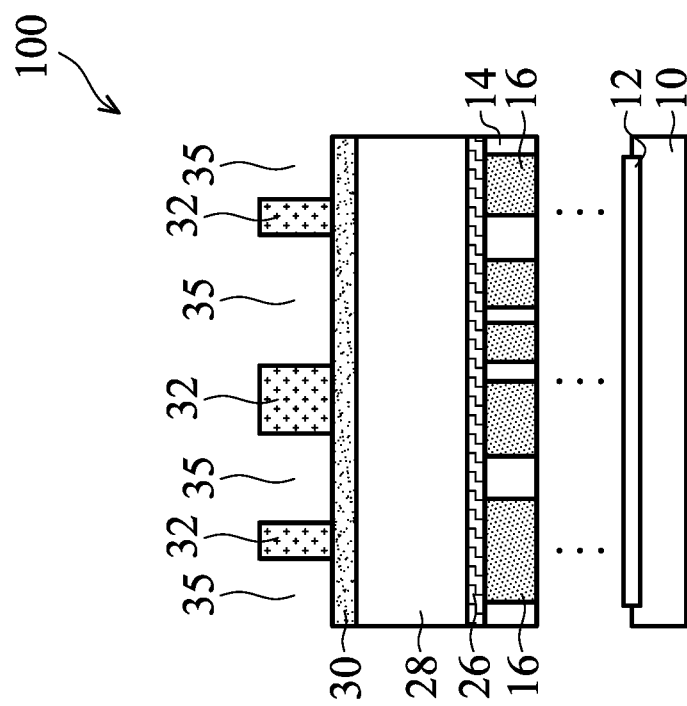

An etching process is then performed to transfer the patterns in photo mask 34 into hard mask 32, and to extend openings 35 into hard mask 32. The respective step is illustrated as step 206 in the process flow shown in FIG. 12. The remaining photo mask 34 is then removed, for example, in an ashing step. The resulting structure is shown in FIGS. 3A and 3B. The etching is anisotropic, so that the openings 35 in hard mask 32 have the same or similar sizes as the respective openings in photo mask 34. In accordance with some embodiments of the present disclosure, openings 35 include some rectangular shaped openings.

In accordance with some exemplary embodiments, the etching of hard mask 32 is performed in a process chamber (not shown), which includes process gases such as $CF_4$, HBr, $Cl_2$, $O_2$, or combinations thereof. The flow rate of the process gases may be in the range between about 3 sccm and about 500 sccm. The pressure of the process gases may be in the range tween about 5 mTorr and about 50 mTorr. It is appreciated that the values recited in the present disclosure are examples, and different values may be adopted.

Figure 4B:
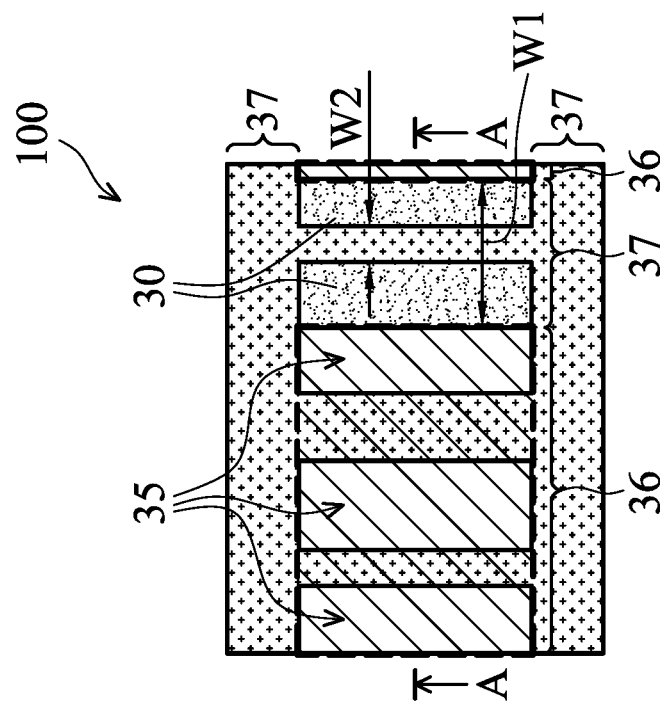
Figure 4A:
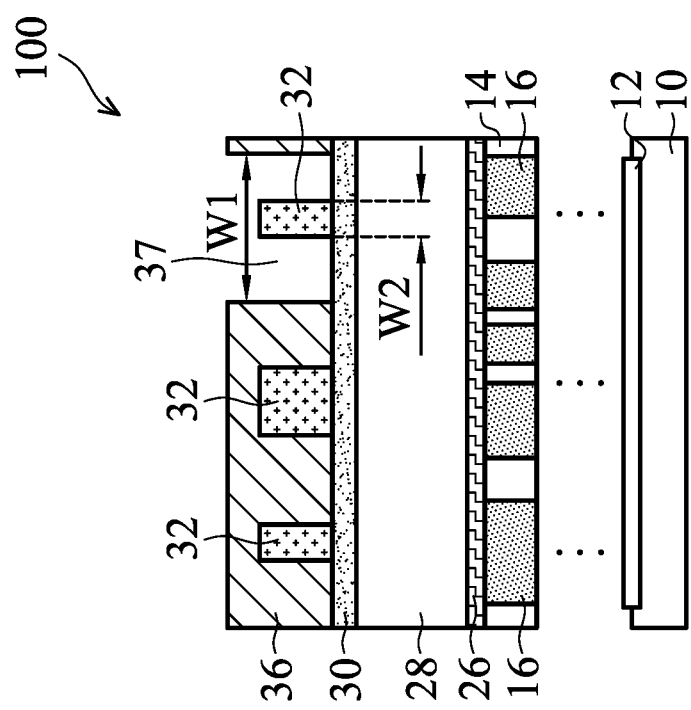

Referring to FIGS. 4A and 4B, treatment mask 36 is applied and patterned. The respective step is illustrated as step 208 in the process flow shown in FIG. 12. In accordance with some embodiments of the present disclosure, treatment mask 36 is formed of a patterned photo resist. In accordance with alternative embodiments, treatment mask is formed of a material that can sustain the temperature of the subsequent plasma treatment if a plasma treatment is adopted. Treatment mask 36 covers some portions of hard mask 32, and leaves some other portions of hard mask 32 exposed. FIGS. 4A and 4B illustrate that implantation mask has opening 37, through which a strip portion and some bulk portions of hard mask 32 are exposed. In order to leave some process margin, the width W1 of opening 37 is greater than the width W2 of the exposed strip portion of hard mask 32.

Figure 5B:
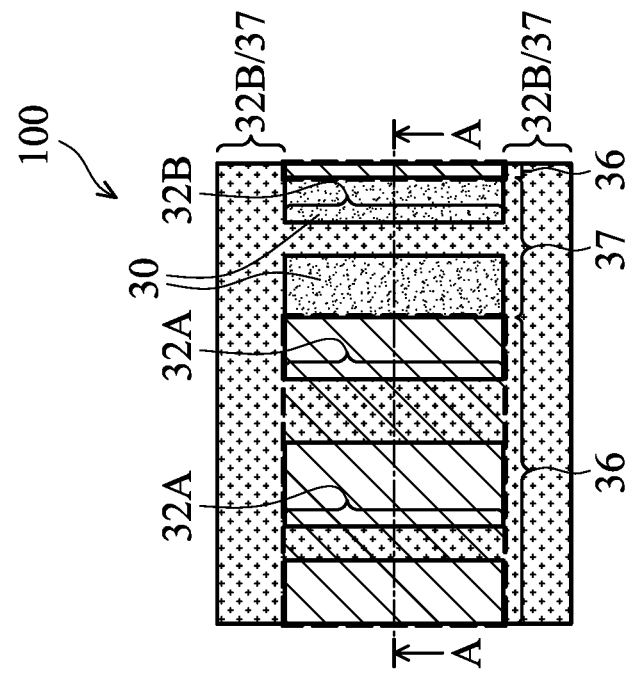
Figure 5A:
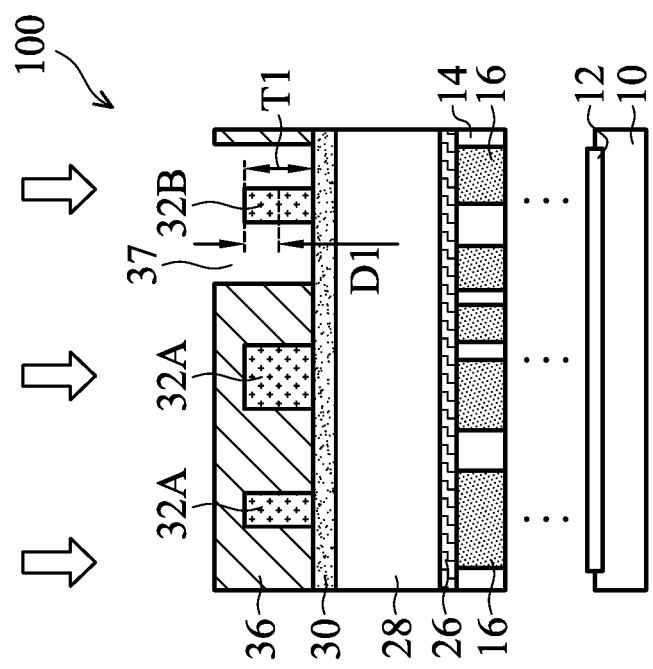

Referring to FIGS. 5A and 5B, a treatment (marked using arrows 39) is performed on the portions of hark mask 32 exposed through the openings in treatment mask 36. The respective step is illustrated as step 210 in the process flow shown in FIG. 12. The portions of hark mask 32 covered by treatment mask 36 are not treated. Throughout the description, the untreated portions of hark mask 32 are referred to as portions 32A, and the treated portions of hard mask 32 are referred to as portions 32B. The treatment modifies the properties of the treated portions 32B, so that the properties of the treated portions 32B and the untreated portions 32A are different from each other. As a result, as will be discussed in subsequent paragraphs, the etching selectivity (the ratio of the etching rate of the untreated portions 32A to the etching rate of the treated portions 32B) is increased to be greater than 1. The etching selectivity may be greater than 10, 20, or 50 in accordance with some embodiments. The materials of the treated portions 32B are also different from that of untreated portions 32A.

In accordance with some embodiments of the present disclosure, the treatment includes an implantation. The implanted species may include boron, oxygen, or the like. In the implantation, the pressure of the process chamber in which the implantation is performed may be in the range between about 2.0 E-5 Torr and about 2.0 E-10 Torr. The temperature of wafer 100 may be in the range between about 20° C. and about 60° C. during the implantation. The implantation energy is partially determined by the thickness of hard mask 32, and higher implantation energy may be used if hard mask 32 is thicker. In accordance with some exemplary embodiments, the implantation energy is in the range between about 1 KeV and about 30 KeV.

In accordance with alternative embodiments of the present disclosure, the treatment includes a plasma treatment. The process gas for generating the plasma includes oxygen ($O_2$), carbon dioxide ($CO_2$), or the like. The pressure of the process may be in the range between about 3 mTorr and about 100 mTorr. The plasma treatment may be performed for a period of time between about 0.5 minutes and about 15 minutes.

After the treatment, treatment mask 36 is removed. Next, a baking process may be performed to bake the treated wafer 100. The respective step is illustrated as step 212 in the process flow shown in FIG. 12. In accordance with some embodiments of the present disclosure, the baking step is skipped. In accordance with some embodiments of the present disclosure, the baking process is performed for a period of time between about 5 minutes and about 20 minutes. The baking temperature may be in the range between about 250° C. and about 500° C. The baking process may result in the restore of the material of hard mask 32, and possibly the reaction of the implanted species (or the species carried by plasma) to react with hard mask 32, so that a compound is formed.

In accordance with alternative embodiments, instead of implantation or plasma treatment, the species that are used for the implantation or plasma treatment is blanket deposited on treatment mask 36 as a species layer (not shown). The species layer contacts portions 32B, which are to be treated, while treatment mask 36 separates the deposited species layer from portions 32A, which are not to be treated. A baking process is then preformed to drive the deposited species into portions 32B, but not into portions 32A.

The treatment (and the likely baking, if any) results in the properties of at least a top surface portion (or an entirety) of the treated portions 32B to be changed. Accordingly, throughout the description, the treatment is alternatively referred to as the modification of portions 32B. The portions with the properties modified may have depth D1 greater than about ⅓ of thickness T1 of hard mask 32. Ratio D1/T1 may also be in the range between (and including) about ⅓ and 1 (which means hard mask 32 is treated to full depth). In accordance with some exemplary embodiments, the material of the treated portions 32B includes silicon oxide, silicon oxy-carbide, or boron-doped silicon. The treated portions 32B may also include islands of silicon oxide, silicon oxy-carbide, or boron-doped silicon isolated from each other by the original material (before treatment) of hard mask 32, which may include amorphous silicon.

Figure 6:
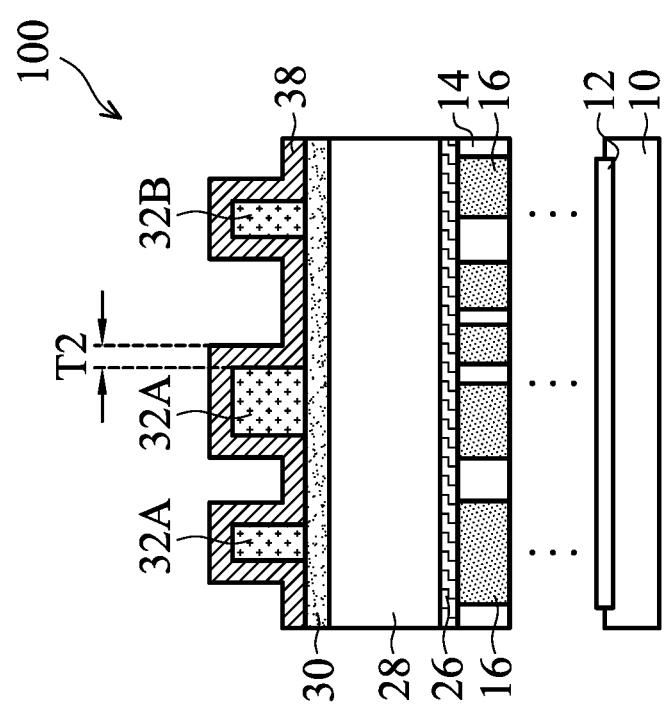

Referring to FIG. 6, spacer layer 38 is blanket formed over the wafer 100 shown in FIGS. 5A and 5B. The respective step is illustrated as step 214 in the process flow shown in FIG. 12. The material of spacer layer 38 may be selected to have a high etching selectivity relative to hard mask 30. For example, the material of spacer layer 38 may be selected from AlO, AlN, AlON, TaN, TiN, TiO, Si, $SiO_2$, SiN, and other metals and metal alloys.

As also shown in FIG. 6, spacer layer 38 is formed as a conformal layer, and the thicknesses of the horizontal portions and vertical portions of spacer layer 38 are close to each other, for example, with a difference smaller than about 20 percent. In accordance with some exemplary embodiments, thickness T2 of spacer layer 38 is in the range between about 5 nm and about 35 nm. Spacer layer 38 may be deposited using a conformal deposition method such as CVD or ALD.

Figure 7B:
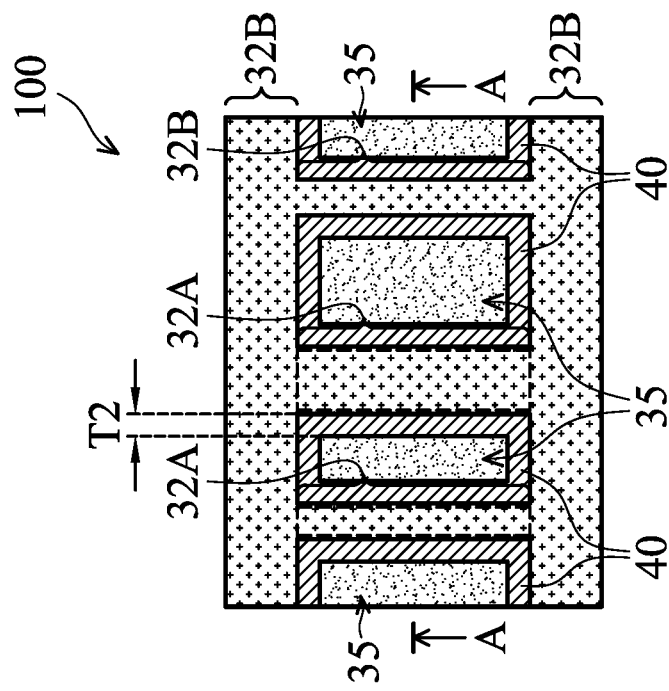

An anisotropic etching is then performed to remove the horizontal portions of spacer layer 38, while the vertical portions of spacer layer 38 remain. The respective step is illustrated as step 216 in the process flow shown in FIG. 12. The remaining portions of spacer layer 38 are referred to as spacers 40 hereinafter. The result structure is shown in FIGS. 7A and 7B, which include a cross-sectional view and a top view, respectively.

Figure 7A:
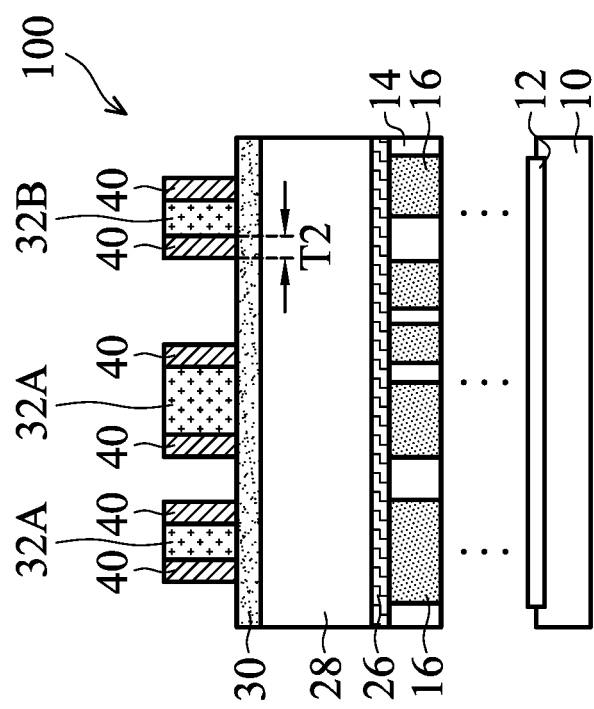

As shown in FIG. 7A, spacers 40 are on the sidewalls of hard mask portions 32A and 32B. Referring to FIG. 7B, spacers 40 may form rings encircling the unfilled portions of openings 35. Hard mask 30 may be exposed through the unfilled portions of openings 35. Spacers 40 have substantially uniform thicknesses T2.

Referring to FIGS. 8A and 8B, hard mask 32 is selectively etched in an etching step, so that the untreated portions 32A (shown in FIGS. 7A and 7B) are removed, forming openings 42 between spacers 40. The respective step is illustrated as step 218 in the process flow shown in FIG. 12. The treated portions 32B of hard mask 32 remain, which portions are illustrated in FIG. 8B. Due to the treatment, the properties of the untreated portions 32A and treated portions 32B are different from each other, and hence by selecting an appropriate etchant, the untreated portions 32A are etched, while the treated portions 32B of hard mask 32 are not etched, even if portions 32A and 32B are both exposed to the etchant. The treated portions 32B of hard mask 32 may be thinned during the removal of untreated portions 32A. In accordance with some embodiments, the etching is performed using a wet etch or a dry etch. The respective etchant (represented by arrows 43) may include an HF solution or a mixture of $NF_3$ and $NH_3$ gases, and the appropriate etchant depends from the material of hard mask portions 32A and 32B. The etching may be performed without using any photo resist to cover wafer 100.

Spacers 40 and treated portions 32B in combination, as shown in FIG. 8B, form regions that encircle openings 35 and 42, which may have the shape of strips in the top view as shown in FIG. 8B.

Figure 9B:
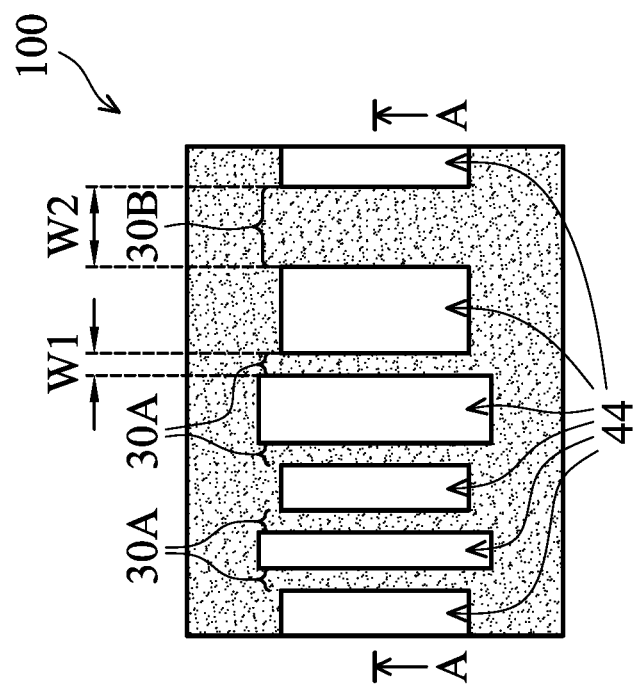
Figure 9A:
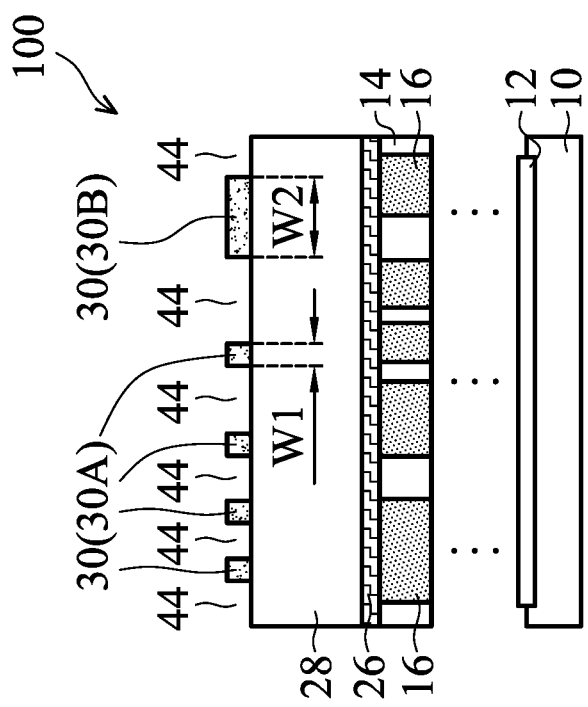

In a subsequent step, spacers 40 and treated portions 32B of hard mask 32 are in combination used as an etching mask to etch the underlying hard mask 30. The respective step is illustrated as step 220 in the process flow shown in FIG. 12. Accordingly, the portions of hard mask 30 not covered by spacers 40 and treated portions 32B are removed. Spacers 40 and treated portion 32B are then removed, and the resulting structure is shown in FIGS. 9A and 9B. Openings 35 and 42 as shown in FIGS. 8A and 8B are transferred into hard mask 30 to form openings 44.

As shown in FIG. 9B, hard masks 30 include strip portions 30A and 30B. Strip portions 30A have width/thickness W1, which is determined by, and may be equal to, thickness T2 of spacers 40 as shown in FIG. 7A. Strip portion 30B has width W2. Since strip portion 30B in FIG. 9A is formed using the overlying spacers 40 and treated portion 32B (FIG. 8A) as an etching mask, width W2 of strip portion 30B is equal to two times thickness W1 plus the width of treated portion 32B, as can be found from FIG. 8A. Accordingly, by treating some portions of hard masks 32 so that these portions of hard mask 32 left in the structure shown in FIG. 8A, hard mask 30 in FIG. 9A can have widths different from the width W1, which is determined by the thickness of spacers 40 (FIG. 7A). This results in the subsequently formed metal lines to have flexible spacings.

Figure 10B:
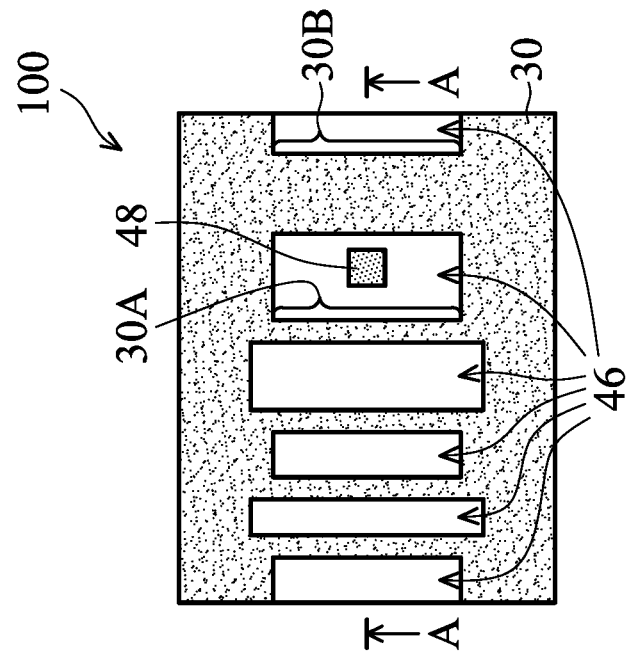
Figure 10A:
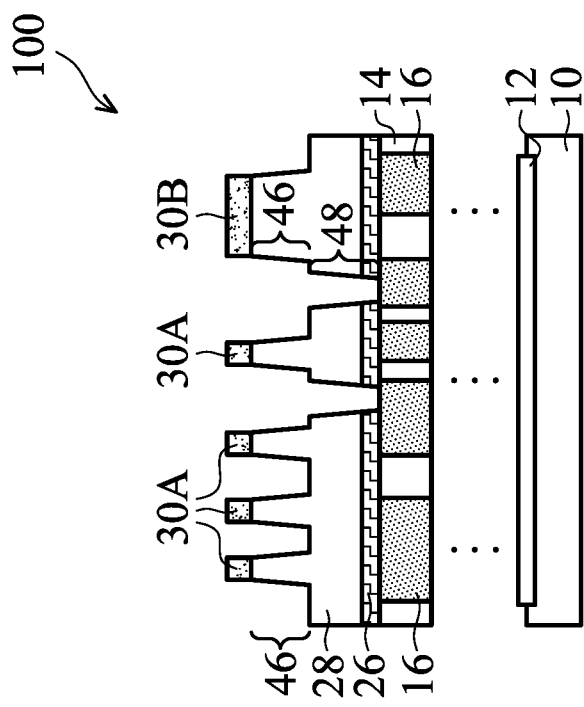

Referring to FIGS. 10A and 10B, hard mask 30 is used as an etching mask to etch the underlying dielectric layer 28, so that trenches 46 are formed. The respective step is illustrated as step 222 in the process flow shown in FIG. 12. Additional process steps are also performed to define and etch low-k dielectric layer 28 to form via openings 48 underlying trenches 46. Etch stop layer 26 is also etched. Conductive features 16 are exposed through via openings 48. Next, hard mask 30 is removed. Alternatively, hard mask 30 is removed during or after the subsequent planarization for forming metal lines 50 and vias 52 as shown in FIGS. 11A and 11B.

Figure 11B:
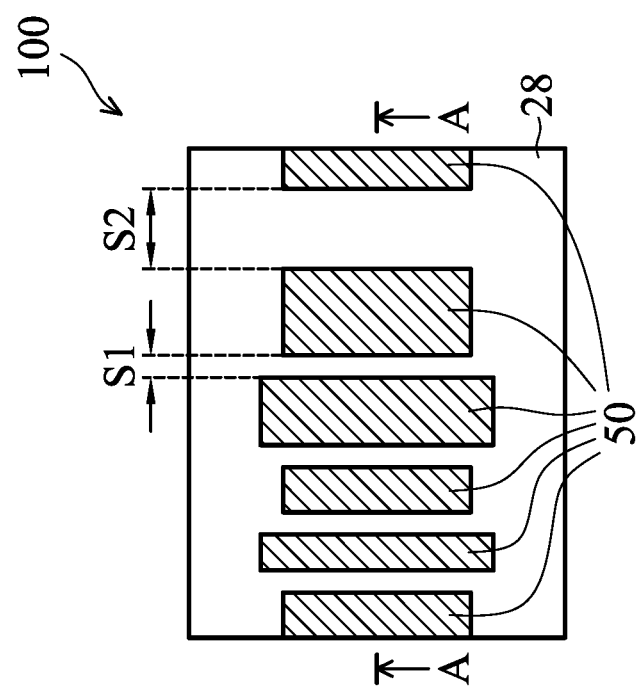
Figure 11A:
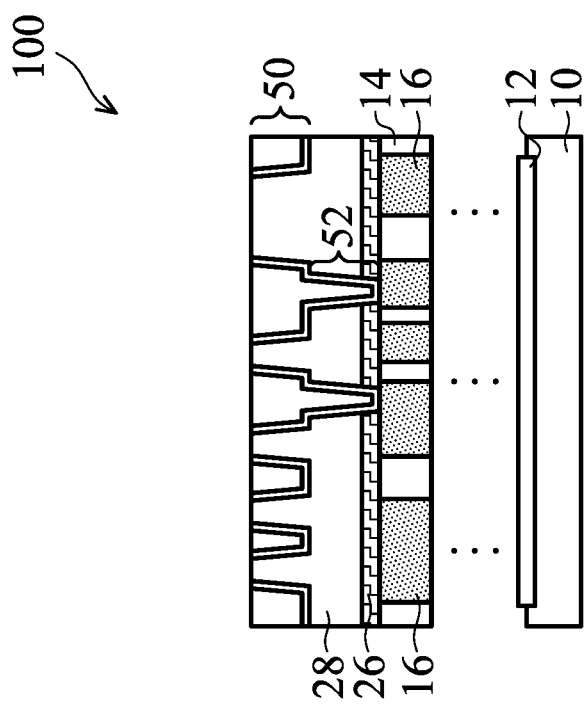

Trenches 46 and via openings 48 are then filled with a conductive material(s) to form metal lines 50 and vias 52, as shown FIGS. 11A and 11B. The respective step is illustrated as step 224 in the process flow shown in FIG. 12. The formation may use a dual damascene process, wherein a conductive barrier layer such as titanium nitride, titanium, tantalum nitride, tantalum, or the like is formed on the sidewalls and the bottoms of trenches 46 and via openings 48. The remaining portions of trenches 46 and via openings 48 are then filled with a conductive material, which may include copper or copper alloy. A Chemical Mechanical Polish (CMP) is then performed to remove excess portions of the barrier layer and the filling metal, forming metal lines 50 and vias 52 as shown in FIGS. 11A and 11B. Metal lines 50 and vias 52 are electrically connected to the underlying conductive features 16. The CMP may be stopped on low-k dielectric layer 28, as shown in FIG. 11A, or may be stopped on hard mask 30 if hard mask 30 has not been removed yet.

In accordance with alternative embodiments of the present disclosure, target layer 28 is a semiconductor substrate. Accordingly, the process step shown in FIGS. 1 through 11A and 11B may be used to form trenches in target layer 28, and filling the trenches with a dielectric material to form Shallow Trench Isolation (STI) regions.

FIG. 11B illustrates a top view of metal lines 50 formed in low-k dielectric layer 28. Metal lines 50 include two spacings S1 and S2, with spacing S2 being greater than spacing S1. Spacing S1 is determined by the thickness T2 (FIG. 7A) of the spacers 40. Advantageously, spacing S2 can be adjusted by adjusting the widths of the treated portions 32B of hard mask 32, as discussed above. Accordingly, the embodiments of the present disclosure have the flexibility in adjusting spacings between metal lines to have different values.

FIGS. 13A and 13B through FIGS. 22A and 22B illustrate cross-sectional views of intermediate stages in the formation of features such as metal lines in accordance with some embodiments of the present disclosure. These embodiments may be used to form two metal lines with lengthwise directions aligned to a straight line, with the ends of the two metal lines close to and facing each other. Unless specified otherwise, the materials and the formation methods of the components in these embodiments are essentially the same as the like components, which are denoted by like reference numerals in the embodiments shown in FIGS. 1 through 11A and 11B. The details regarding the formation process and the materials of the like components shown in FIGS. 13A and 13B through FIGS. 22A and 22B may thus be found in the discussion of the embodiment shown in FIG. 1 through FIGS. 11A and 11B.

Figure 13A:
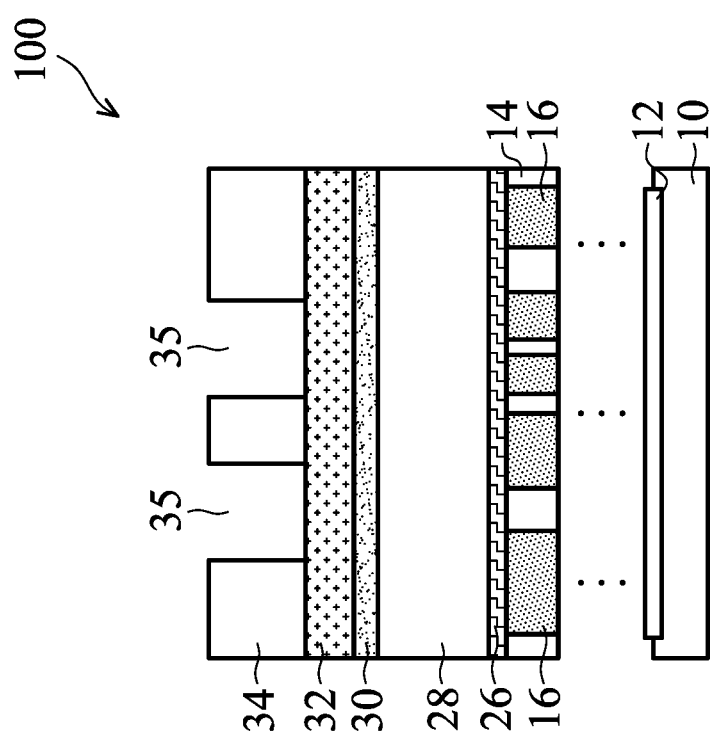
Figure 13B:
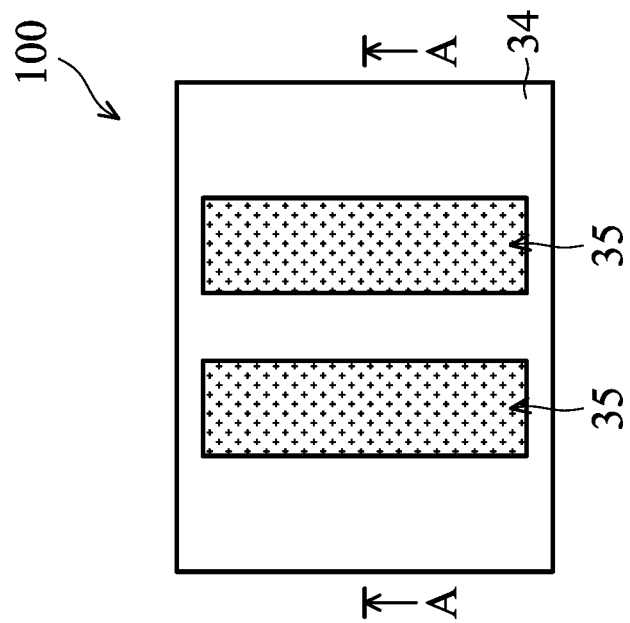
Figure 23:
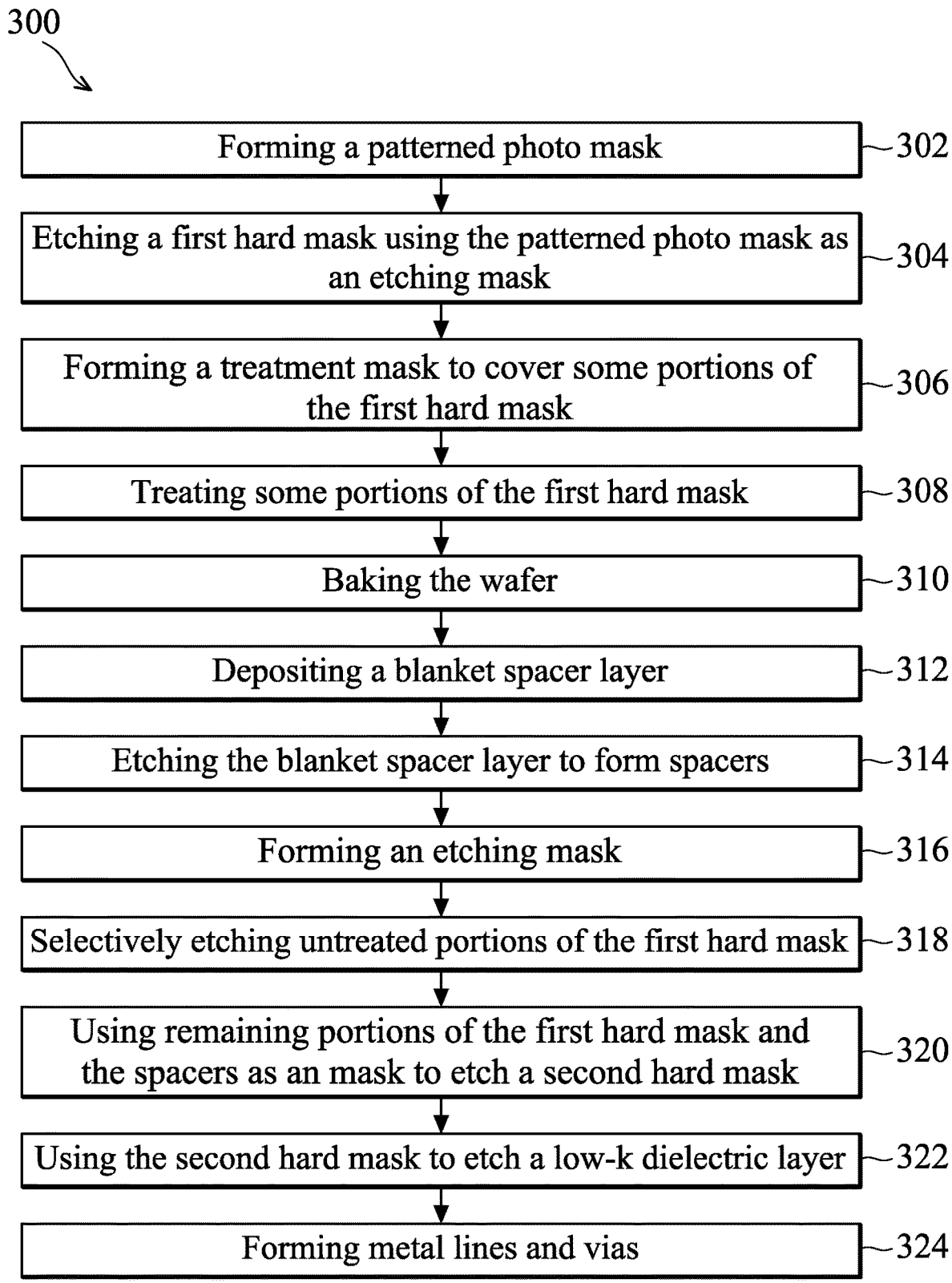
FIG. 23 illustrates a process flow for forming metal lines in accordance with some embodiments.

FIGS. 13A and 13B illustrate an initial structure, which includes semiconductor substrate 10, devices 12, dielectric layer 14, conductive features 16, etch stop layer 26, dielectric layer 28, hard mask 30, and hard mask 32. The details of these features are similar to what are shown in FIG. 1, and hence are not repeated herein. Photo mask 34 is formed over hard mask 32, and is patterned to form openings 35 therein. The respective step is illustrated as step 302 in the process flow shown in FIG. 23. In accordance with some embodiments of the present disclosure, as shown in FIG. 13B, openings 35 have top-view shapes of elongated strips, which have lengthwise directions parallel to each other.

Figure 14B:
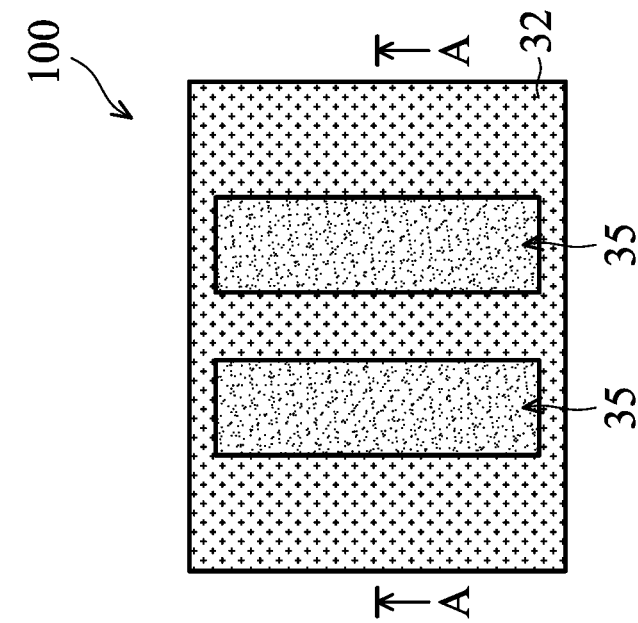
Figure 14A:
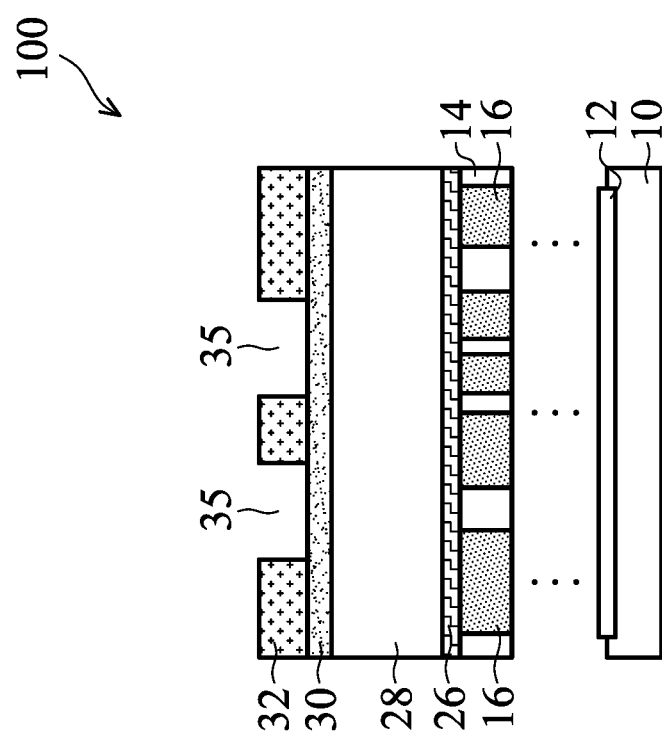

Photo mask 34 is then used as an etching mask to etch hard mask 32, so that openings 35 extend into hard mask 32. The respective step is illustrated as step 304 in the process flow shown in FIG. 23. Photo mask 34 is then removed. The resulting structure is shown in FIGS. 14A and 14B. Next, as shown in FIGS. 15A and 15B, treatment mask 36 is formed and patterned, and opening 37 is formed in treatment mask 36. The respective step is illustrated as step 306 in the process flow shown in FIG. 23. The cross-sectional view shown in FIG. 15A is obtained from the plane containing line A-A in FIG. 15B, wherein the plane crosses opening 37. It shows that treatment mask 36 covers the entire illustrated region of wafer 100 except opening 37. A portion of hard mask 32 is exposed through opening 37, which portion is marked as 32B. The portions of hard mask 32 covered by treatment mask 36 are marked as portions 32A. In FIG. 15B, the positions of openings 35 are marked using dashed lines to show the relative positions of openings 35 and 37.

Next, treatment 39 is performed on the exposed portion(s) 32B of hard mask 32, and portions 32A are not treated. The respective step is illustrated as step 308 in the process flow shown in FIG. 23. The treatment may be performed using a method selected from the same group of candidate methods for performing treatment 39 as shown in FIG. 5A, and the details of the treatment are not repeated herein. The treatment results in the properties of untreated portions 32A and treated portions 32B to be different from each other, so that in subsequent steps, the untreated portions 32A may be removed while the treated portions 32B remain. The materials of the treated portions 32B are also different from that of untreated portions 32A as a result of the treatment, as discussed referring to FIG. 5A. After the treatment, treatment mask 36 is removed, for example, in an ashing step when treatment mask 36 is formed of photo resist.

Next, a baking process may be performed to bake the treated wafer 100. The respective step is illustrated as step 310 in the process flow shown in FIG. 23. In accordance with other embodiments of the present disclosure, the baking step is skipped. In accordance with some embodiments of the present disclosure, the baking process is performed for a period of time between about 5 minutes and about 20 minutes. The baking temperature may be in the range between about 250° C. and about 500° C. The baking process may result in the restore of the material of hard mask 32, and possibly the reaction of the implanted species (or the species carried by plasma) to react with hard mask 32 to form a compound.

Figure 16:
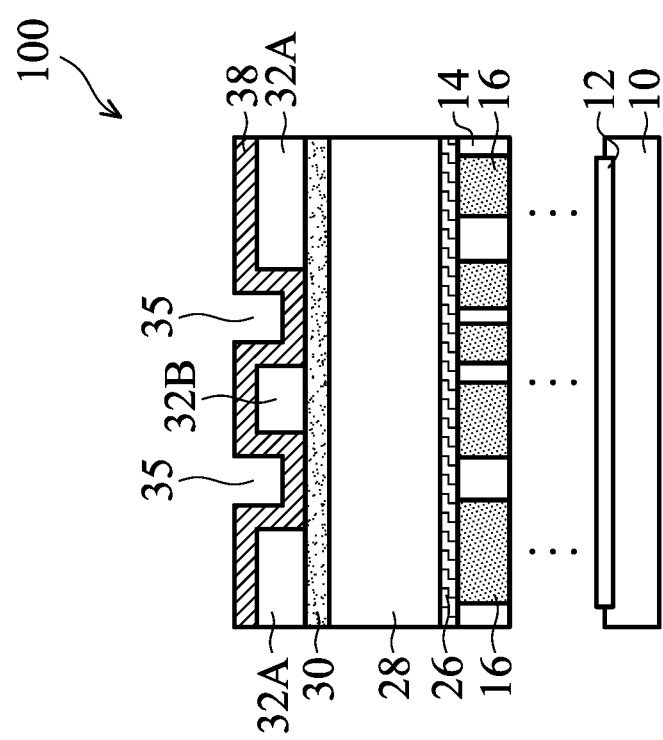

Referring to FIG. 16, spacer layer 38 is blanket formed over wafer 100 through deposition. The respective step is illustrated as step 312 in the process flow shown in FIG. 23. The material of spacer layer 38 may be selected to have a high etching selectivity with hard mask 32. For example, the material of spacer layer 38 may be selected from AlO, AlN, AlON, TaN, TiN, TiO, Si, SiO, SiN, and other metals and metal alloys. Spacer layer 38 may be a conformal layer deposited using a conformal disposition method such as CVD or ALD.

Figure 17B:
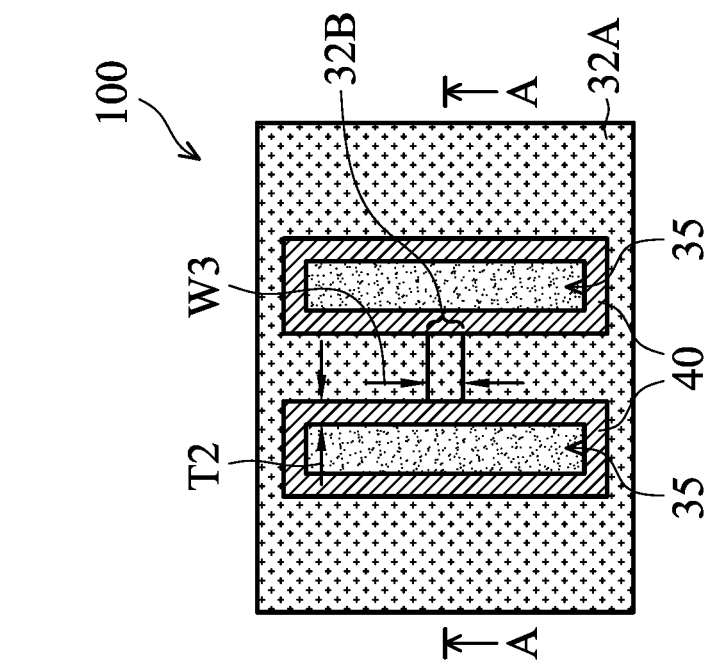
Figure 17A:
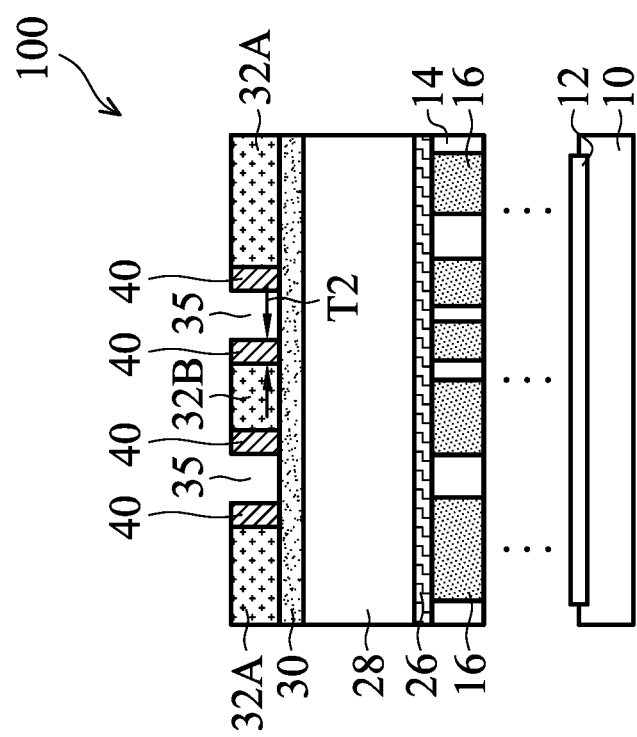

An anisotropic etching is then performed to remove the horizontal portions of spacer layer 38, while the vertical portions of spacer layer 38 remain. The remaining vertical portions are referred to as spacers 40 hereinafter. The respective step is illustrated as step 314 in the process flow shown in FIG. 23. The resulting structure is shown in FIGS. 17A and 17B, which include a top view and a cross-sectional view, respectively. Spacers 40 form two rings, which are interconnected by treated portion 32B of hard mask 32.

In accordance with some embodiments of the present disclosure, width W3 of the treated portion 32B is greater than 2*(T2), with thickness T2 being the thickness of spacers 40. Width W3 may also be in the range between about 3 times and about 6 times thickness T2. In accordance with some embodiments of the present disclosure, width W3 is in the range between 1 time and about 5 times the minimum size (such as the width) that can be defined in the respective manufacturing process. As will be shown in FIG. 22B, width W3 defines the spacing between the two end portions of metal lines 50. Accordingly, the embodiments in the present disclosure have the flexibility of adjusting the spacing between the end portions of metal lines. Also, the spacing between the end portions of metal lines is free from the failure that may occur in conventional spacing-define methods.

Figure 18B:
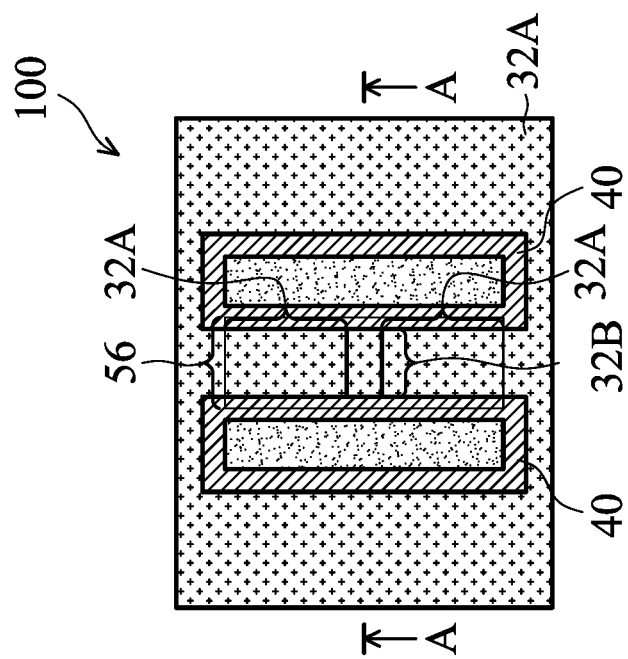
Figure 18A:
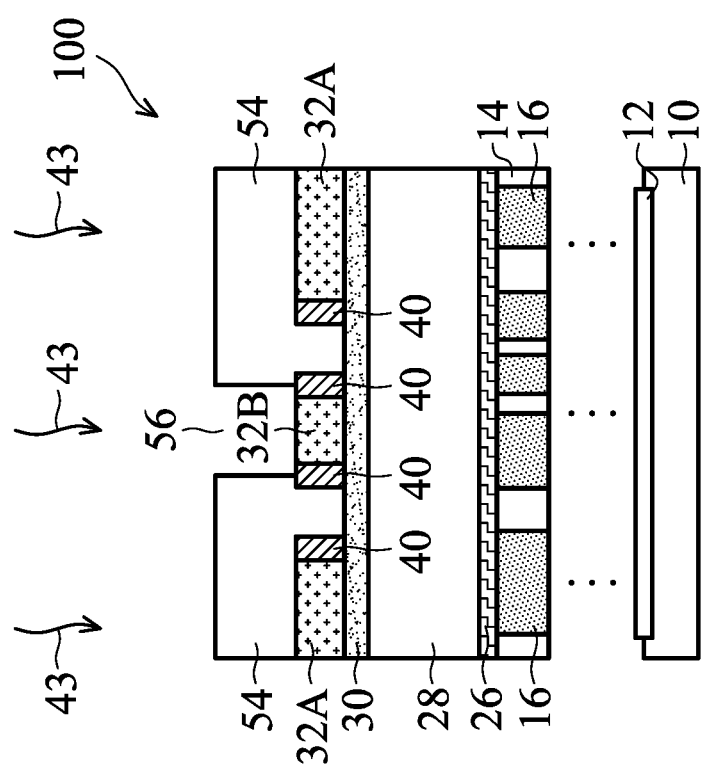

Referring to FIGS. 18A and 18B, etching mask 54 (which may be a photo resist) is formed and patterned, with opening 56 formed in photo resist 54. The respective step is illustrated as step 316 in the process flow shown in FIG. 23. As shown in FIG. 18A, treated portion 32B of hard mask 32 is exposed to opening 56. As shown in FIG. 18B, photo resist 54 covers the entirety of the illustrated portion of wafer 100 except the region marked as 56 (the opening). Accordingly, untreated portion 32B and two treated portions 32A of hard mask 32 are exposed through opening 56. Some portions of spacers 40 are also exposed through opening 56 in order to provide some process margin.

Next, a selective etching step is performed using photo resist 54 as an etching mask. The respective step is illustrated as step 318 in the process flow shown in FIG. 23. The respective etchant is represented by arrows 43. The etchant is selected to attack untreated portions 32A, and does not attack treated portion 32B and spacers 40. Accordingly, after the etching, untreated portions 32A are removed, while treated portion 32B has at least a bottom portion, and may be a majority, left. After the etching, photo resist 54 is removed. The resulting structure is shown in FIGS. 19A and 19B.

Figure 19B:
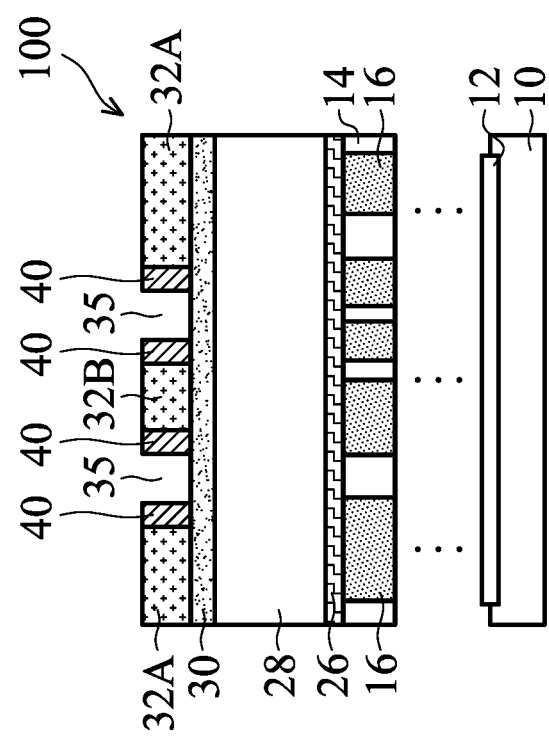
Figure 19A:
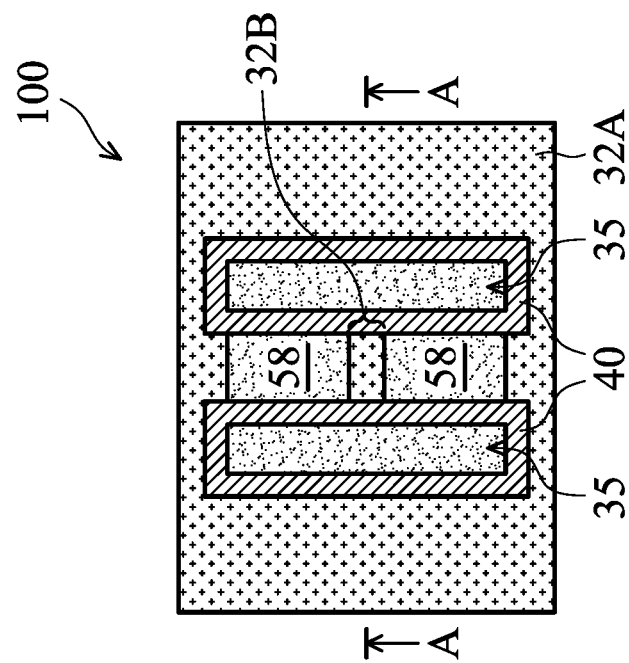

The removed untreated portions 32A left openings 58, as shown in FIG. 19B. Openings 58 are defined by spacers 40, untreated portion 32B, and the remaining treated portions 32A, which were not removed due to the protection of photo resist 54.

Figure 20B:
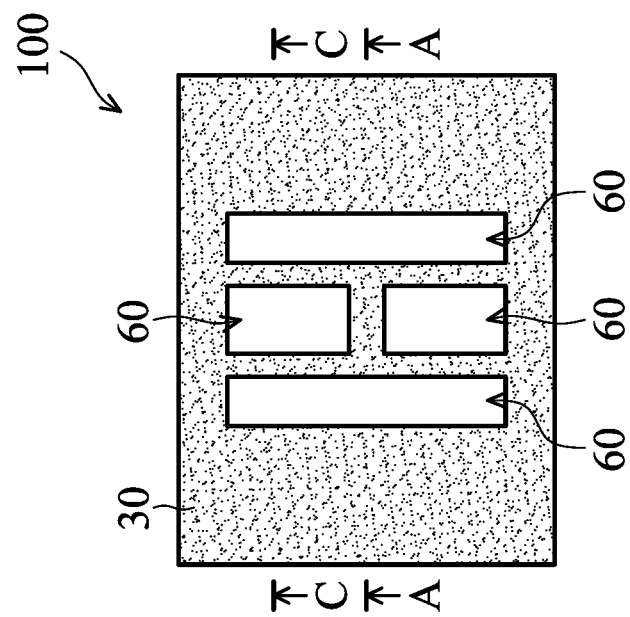
Figure 20A:
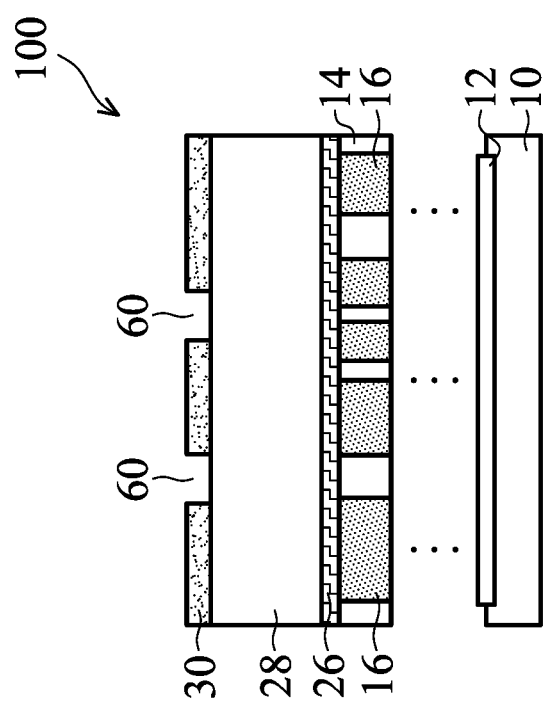
Figure 20C:
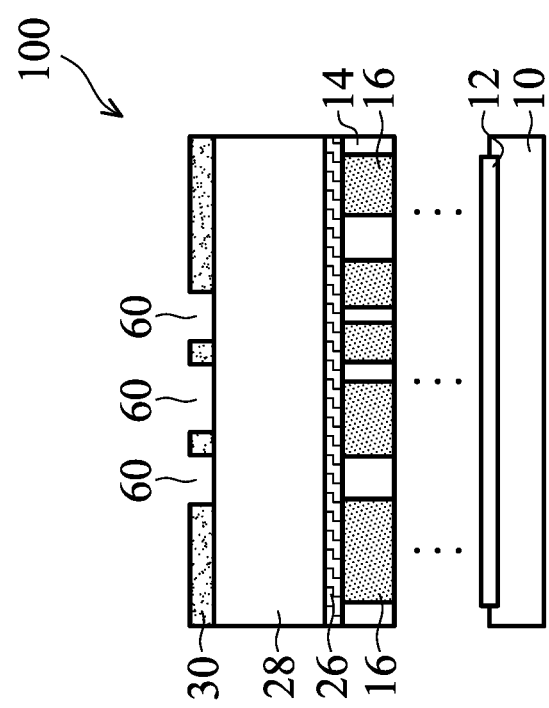

FIGS. 20A, 20B, 20C, 21A, 21B, and 21C illustrate the transferring of the patterns of openings 35 and 58 (FIG. 19B) into the underlying layers. FIGS. 20A and 20C illustrate the cross-sectional views obtained from the planes containing line A-A and line C-C, respectively, in FIG. 20B. First, hard mask 30 is etched using spacers 40, untreated portion 32B, and the remaining treated portions 32A as an etching mask. The respective step is illustrated as step 320 in the process flow shown in FIG. 23. The resulting openings 60 as shown in FIGS. 20A, 20B and 20C are the downward extensions of openings 35 and 58. After the etching, spacers 40 and hard mask 32 (FIG. 19A) are removed.

Figure 21B:
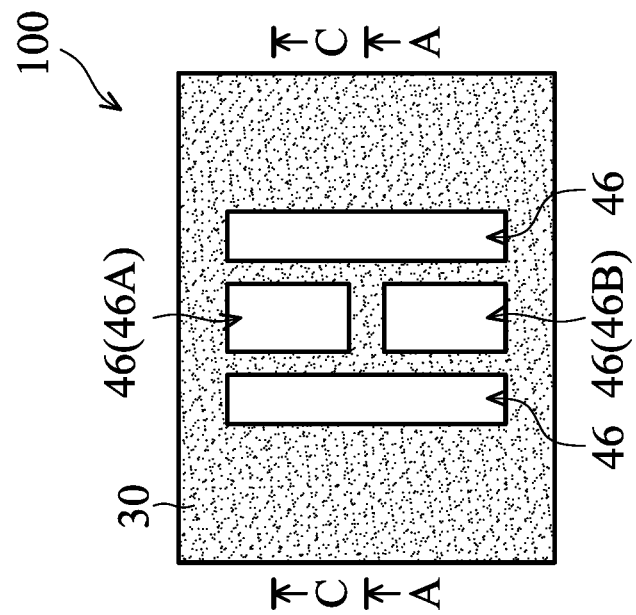
Figure 21A:
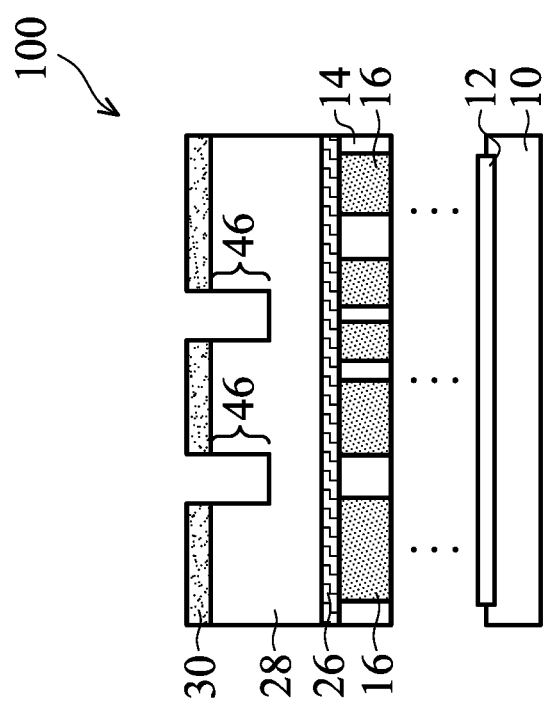
Figure 21C:
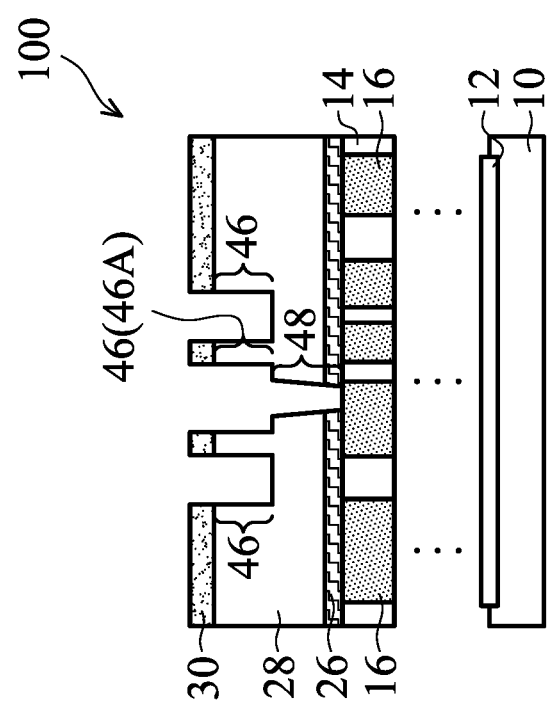

Next, referring to FIGS. 21A, 21B and 21C, hard mask 30 is used as an etching mask to etch dielectric layer 28, which may be a low-k dielectric layer in accordance with some embodiments of the present disclosure. The respective step is illustrated as step 322 in the process flow shown in FIG. 23. FIGS. 21A and 21C illustrate the cross-sectional views obtained from the planes containing line A-A and line C-C, respectively, in FIG. 21B. Trenches 46 (including 46A and 46B) are formed in dielectric layer 28. Additional process steps are also performed to define and etch low-k dielectric layer 28 to form via opening(s) 48 underlying trench 46A (FIGS. 21B and 21C). Etch stop layer 26 is also etched. Conductive features 16 are exposed through trench 46A and via openings 48. Next, hard mask 30 is removed. Alternatively, hard mask 30 is removed during or after the planarization for forming metal lines 50 and vias 52 as shown in FIGS. 22A and 22B.

Figure 22B:
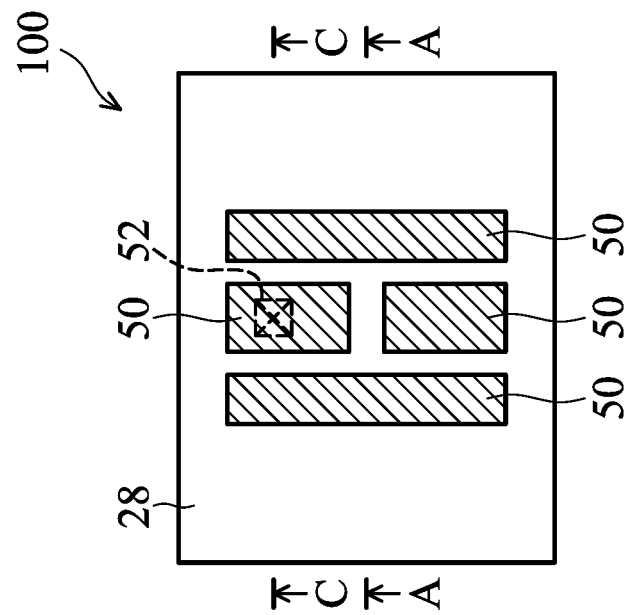
Figure 22A:
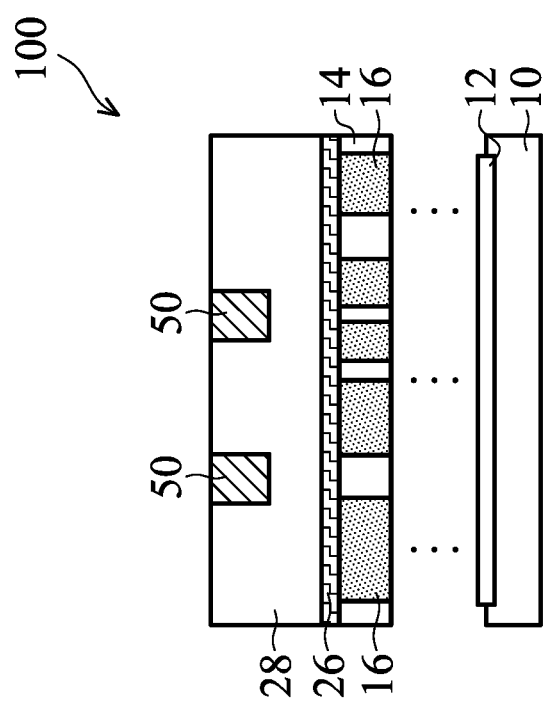
Figure 22C:
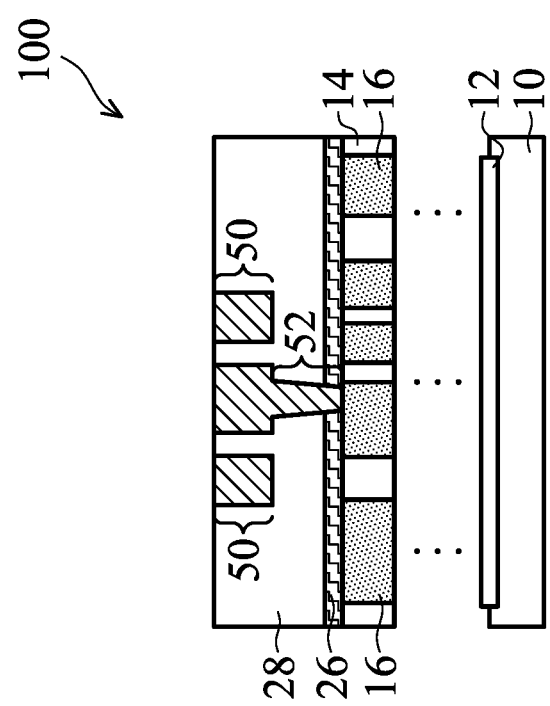

Trenches 46 and via openings 48 as shown in FIGS. 21A, 21B and 21C are then filled with a conductive material(s) to form metal lines 50 and vias 52, as shown FIGS. 22A, 22B and 22C. The respective step is illustrated as step 324 in the process flow shown in FIG. 23. FIGS. 22A and 22C illustrate the cross-sectional views obtained from the planes containing line A-A and line C-C, respectively, in FIG. 22B. The formation may include a dual damascene process, in which a conductive barrier layer such as titanium nitride, titanium, tantalum nitride, tantalum, or the like is formed on the sidewalls and the bottoms of trenches 46 and via openings 48. The remaining portions of trenches 46 and via openings 48 are then filled with a conductive material, which may include copper or a copper alloy. A planarization such as CMP or mechanical grinding is then performed to remove excess portions of the barrier layer and the filling metal, forming metal lines 50 and vias 52 as shown in FIGS. 22A, 22B and 22C. Metal lines 50 and vias 52 are electrically connected to the underlying conductive features 16. The CMP may be stopped on low-k dielectric layer 28, as shown in FIG. 22A, or may be stopped on hard mask 30 if hard mask 30 has not been removed yet. Metal lines 50 may have spacing between 1 time and 3 times the minimum width of metal lines that can be formed in the respective technology. The widths and spacings of metal lines 50 may be in the range between about 5 nm and about 35 nm in accordance with some embodiments.

In accordance with some embodiments of the present disclosure, the untreated portions 32A are etched, and the treated portions 32B are used in combination with spacers 40 as an etching mask to etch underlying layers. In accordance with some embodiments of the present disclosure, the treated portions 32B may be etched, and the untreated portions 32A may be used in combination with spacers 40 as an etching mask to etch underlying layers. The patterns of the treated portions and untreated portions may be inversed in these embodiments.

The embodiments of the present disclosure have some advantageous features. By performing a treatment on a hard mask to distinguish the properties of some portions of the hard mask from other portions, the hard mask may be selectively left when other portions of the hard mask are selectively etched. Accordingly, the remaining portions of the hard mask can be used as an etching mask to etch underlying layers. As a result, the spacing between the formed features can be adjusted, and the flexibility in the formation of the features is improved.

In accordance with some embodiments of the present disclosure, a method includes forming a first hard mask over a target layer; performing a treatment on a first portion of the first hard mask to form a treated portion, with a second portion of the first hard mask left untreated as an untreated portion; subjecting both the treated portion and the untreated portion of the first hard mask to etching, wherein the untreated portion is removed as a result of the etching, and the treated portion remains after the etching; and etching a layer underlying the first hard mask, wherein the treated portion of the first hard mask is used as a part of an etching mask in the etching. In an embodiment, the method further includes forming a spacer on a sidewall of the treated portion of the first hard mask, wherein in the etching the layer underlying the first hard mask, both the spacer and the treated portion of the first hard mask are in combination used as the etching mask. In an embodiment, the treatment comprises a plasma treatment. In an embodiment, the treatment comprises an implantation. In an embodiment, the method further includes performing a baking step after the treatment. In an embodiment, the etching the layer underlying the first hard mask comprises: etching a second hard mask using the treated portion of the first hard mask as a part of the etching mask; and etching a dielectric layer underlying the second hard mask to form a trench. In an embodiment, the method further includes filling a conductive material into a trench formed by the etching the layer to form a conductive line.

In accordance with some embodiments of the present disclosure, a method includes forming a first hard mask; forming a second hard mask over the first hard mask; patterning the second hard mask to form a first opening therein; modifying a first portion of the second hard mask to have properties different from a second portion of the second hard mask; forming a spacer on a sidewall of the first portion of the second hard mask; removing the second portion of the second hard mask, with the first portion of the second hard mask remaining after the removing; and transferring patterns of the first portion of the second hard mask and the spacer into an underlying layer. In an embodiment, during the removing the second portion of the second hard mask, the first portion of the second hard mask is subject to a same etchant for etching the second portion. In an embodiment, the transferring the patterns includes etching the first hard mask using the first portion of the second hard mask and the spacer in combination as an etching mask; etching a dielectric layer underlying the first hard mask to form a trench; and filling the trench to form a metal line. In an embodiment, the forming the spacer includes forming a blanket spacer layer extending into the first opening; and removing horizontal portions of the blanket spacer layer, with a portion of vertical portions of the blanket spacer layer being the spacer. In an embodiment, the spacer forms a ring encircling a middle portion of the first opening. In an embodiment, the modifying the first portion of the second hard mask comprises: forming a treatment mask having a second opening therein, wherein the first portion of the second hard mask is exposed through the second opening; and performing a treatment to modify the first portion of the second hard mask. In an embodiment, the treatment comprises an implantation with oxygen or boron being used as an implanted species. In an embodiment, the treatment comprises a plasma treatment using oxygen or carbon dioxide to generate plasma. In an embodiment, the method further includes performing a baking step after the treatment.

In accordance with some embodiments of the present disclosure, a method includes forming a first opening, a second opening, a third opening, and a fourth opening in a hard mask; forming a treatment mask covering a first portion of the hard mask between the first opening and the second opening, wherein a second portion of the hard mask between the third opening and the fourth opening is exposed through an opening in the treatment mask; performing a treatment on the second portion of the hard mask; removing the treatment mask; exposing both the first portion and the second portion of the treatment mask to an etchant, wherein the first portion is etched by the etchant, and the second portion has at least a bottom portion remaining; forming spacers in the first opening, the second opening, the third opening, and the fourth opening; and using the spacers and the second portion of the hard mask as an etching mask to etch an underlying layer. In an embodiment, the treatment comprises an implantation or a plasma treatment. In an embodiment, the hard mask comprises amorphous silicon, and the treatment is performed using an oxygen-containing species. In an embodiment, the method further includes baking the treated hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various modifies, substitutions, and alterations herein without departing from the spirit and scope of the present disclosure.

What is claimed is:

1. A method comprising:
forming a first hard mask over a target layer, wherein the target layer comprises a low-k dielectric layer;
forming a treatment mask comprising an opening;
performing a treatment on a first portion of the first hard mask to form a treated portion, with a second portion of the first hard mask left untreated as an untreated portion, wherein during the treatment, the first portion of the first hard mask is exposed through the opening in the treatment mask, and the second portion of the first hard mask is covered by the treatment mask;
performing an etching process to remove a first one of the treated portion and the untreated portion of the first hard mask using an etching chemical, wherein a second one of the treated portion and the untreated portion remains after the etching process; and
etching the target layer, wherein the second one of the treated portion and the treated portion is used as a part of an etching mask in the etching, and wherein the etching the target layer underlying the first hard mask comprises:
etching a second hard mask underlying the first hard mask; and etching the low-k dielectric layer using the second hard mask as an additional etching mask to form trenches.

2. The method of claim 1, wherein the first one of the treated portion and the untreated portion is the untreated portion.

3. The method of claim 1, wherein the second one of the treated portion and the untreated portion is the untreated portion.

4. The method of claim 1 further comprising:
forming sidewall spacers on sidewalls of both of the treated portion and the untreated portion, wherein the etching process is performed after the sidewall spacers are formed.

5. The method of claim 4, wherein the etching mask for etching the target layer comprises the sidewall spacers on the sidewalls of both of the treated portion and the untreated portion.

6. The method of claim 1, wherein in the etching process, both of the treated portion and the untreated portion are in physical contact with the etching chemical.

7. The method of claim 1, wherein the treatment comprises implanting a dopant into the first portion of the first hard mask, and the second portion of the first hard mask is protected by the treatment mask from being implanted.

8. The method of claim 7, wherein the dopant implanted during the treatment comprises boron or oxygen.

9. The method of claim 1, wherein the treatment comprises performing a plasma treatment using a process gas, wherein the first portion of the first hard mask is exposed to a plasma generated from the process gas, and the second portion of the first hard mask is separated from the plasma by the treatment mask.

10. A method comprising:
forming a first hard mask;
forming a second hard mask over the first hard mask;
implanting a first portion of the second hard mask with a dopant, wherein a second portion of the second hard mask is protected from the implanting;
forming a first spacer on a sidewall of the first portion of the second hard mask;
removing a first one of the first portion and the second portion of the second hard mask using an etchant, with a second one of the first portion and the second portion of the second hard mask remaining after the removing, and wherein both of the first one and the second one of the first portion and the second portion are exposed to the etchant; and
transferring patterns of the second one and the first spacer into an underlying layer.

11. The method of claim 10 further comprising forming a second spacer on a sidewall of the second portion of the second hard mask, wherein in the transferring the patterns, a pattern of the second spacer is also transferred into the underlying layer.

12. The method of claim 10, wherein in the removing, the first portion of the second hard mask is removed.

13. The method of claim 10, wherein in the removing, the second portion of the second hard mask is removed.

14. The method of claim 10, wherein in the implanting, boron is implanted.

15. The method of claim 10, wherein in the implanting, oxygen is implanted.

16. A method comprising:
forming a first opening, a second opening, a third opening, and a fourth opening in a hard mask, wherein the hard mask comprises:
a first portion between the first opening and the second opening; and
a second portion between the third opening and the fourth opening;
performing a treatment on a first one of the first portion and the second portion of the hard mask to form a treated portion, wherein a second one of the first portion and the second portion is an untreated portion protected from the treatment;
exposing both of the first portion and the second portion of the hard mask to an etchant, wherein the first portion is etched by the etchant, and the second portion remains after the exposing;
forming spacers in the first opening, the second opening, the third opening, and the fourth opening; and
using the spacers and the second portion of the hard mask as an etching mask to etch an underlying layer.

17. The method of claim 16, wherein the first portion that is etched by the etchant is the treated portion.

18. The method of claim 16, wherein the first portion that is etched by the etchant is the untreated portion.

19. The method of claim 16, wherein the treatment comprises implanting a dopant into the first one of the first portion and the second portion.

20. The method of claim 16, wherein the treatment comprises a plasma treat, with the first one of the first portion and the second portion being exposed to a plasma of a process gas.

* * * * *